(12) United States Patent
Min et al.

(10) Patent No.: US 11,999,887 B2
(45) Date of Patent: Jun. 4, 2024

(54) CORE SHELL QUANTUM DOT, PRODUCTION METHOD THEREOF, AND ELECTRONIC DEVICE INCLUDING THE SAME

(71) Applicant: SAMSUNG ELECTRONICS CO., LTD., Suwon-si (KR)

(72) Inventors: Jihyun Min, Seoul (KR); Sungwoo Hwang, Suwon-si (KR); Yong Wook Kim, Yongin-si (KR); Ji-Yeong Kim, Suwon-si (KR); Soo Kyung Kwon, Suwon-si (KR); Seon-Yeong Kim, Suwon-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 18/182,428

(22) Filed: Mar. 13, 2023

(65) Prior Publication Data

US 2023/0220279 A1 Jul. 13, 2023

Related U.S. Application Data

(63) Continuation of application No. 17/072,440, filed on Oct. 16, 2020, now Pat. No. 11,603,493.

(30) Foreign Application Priority Data

Oct. 17, 2019 (KR) .................. 10-2019-0129447
Sep. 11, 2020 (KR) .................. 10-2020-0117036

(51) Int. Cl.
*C09K 11/88* (2006.01)
*B82Y 20/00* (2011.01)
(Continued)

(52) U.S. Cl.
CPC ............ *C09K 11/883* (2013.01); *C01B 19/00* (2013.01); *C01G 9/08* (2013.01); *C09K 11/565* (2013.01);
(Continued)

(58) Field of Classification Search
CPC ..... C09K 11/883; C09K 11/565; C01B 19/00; C01G 9/08; H10K 50/115; H10K 59/12;
(Continued)

(56) References Cited

U.S. PATENT DOCUMENTS 6,322,901 B1 11/2001 Bawendi et al.
6,861,155 B2 3/2005 Bawendi et al.
(Continued)

FOREIGN PATENT DOCUMENTS

CN 107121454 A 9/2017
CN 107815310 A 3/2018
(Continued)

OTHER PUBLICATIONS

US 10,703,967, May 12, 2005, Daniel Phillips, et al. (withdrawn).
(Continued)

*Primary Examiner* — Caleb E Henry
(74) *Attorney, Agent, or Firm* — CANTOR COLBURN LLP

(57) ABSTRACT

A core shell quantum dot including a core including a first semiconductor nanocrystal and including zinc, tellurium, and selenium and a semiconductor nanocrystal shell disposed on the core and including a zinc chalcogenide, a method of manufacture thereof, and a device including the same are disclosed, wherein the core shell quantum dot does not include cadmium, lead, mercury, or a combination thereof, wherein in an X-ray photoelectron spectrum of the
(Continued)

quantum dot, a peak area for Te oxide to a peak area for Te3d$_{5/2}$ as an area percentage is less than or equal to about 25%.

20 Claims, 10 Drawing Sheets

(51) Int. Cl.
| | |
|---|---|
| *B82Y 40/00* | (2011.01) |
| *C01B 19/00* | (2006.01) |
| *C01G 9/08* | (2006.01) |
| *C09K 11/56* | (2006.01) |
| *F21V 8/00* | (2006.01) |
| *H10K 50/115* | (2023.01) |
| *H10K 59/12* | (2023.01) |
| *H10K 59/38* | (2023.01) |

(52) U.S. Cl.
CPC ........... *H10K 50/115* (2023.02); *H10K 59/12* (2023.02); *H10K 59/38* (2023.02); *B82Y 20/00* (2013.01); *B82Y 40/00* (2013.01); *C01P 2002/74* (2013.01); *C01P 2006/60* (2013.01); *G02B 6/005* (2013.01)

(58) Field of Classification Search
CPC ........ H10K 59/38; B82Y 20/00; B82Y 40/00; C01P 2002/74; C01P 2006/60; G02B 6/005
See application file for complete search history.

(56) References Cited

U.S. PATENT DOCUMENTS

| | | | |
|---|---|---|---|
| 7,105,051 B2 | 9/2006 | Peng et al. | |
| 7,427,523 B2 | 9/2008 | Boardman et al. | |
| 7,641,815 B2* | 1/2010 | Varadarajan | C09K 11/7435 |
| | | | 252/301.4 H |
| 7,981,667 B2 | 7/2011 | Nie | |
| 8,035,772 B2 | 10/2011 | Kim et al. | |
| 8,252,205 B2 | 8/2012 | Jun et al. | |
| 8,420,155 B2 | 4/2013 | Nie et al. | |
| 8,436,964 B2 | 5/2013 | Kim et al. | |
| 8,545,736 B2 | 10/2013 | Jun et al. | |
| 8,952,239 B2* | 2/2015 | Pfenninger | H01L 31/055 |
| | | | 136/247 |
| 9,082,982 B2 | 7/2015 | Jun et al. | |
| 9,517,936 B2 | 12/2016 | Jeong et al. | |
| 9,577,127 B1* | 2/2017 | Wang | H01L 31/0216 |
| 9,606,281 B2 | 3/2017 | Jang et al. | |
| 9,834,724 B2 | 12/2017 | Kim et al. | |
| 9,933,658 B2 | 4/2018 | Jang et al. | |
| 10,074,770 B2 | 9/2018 | Park et al. | |
| 10,160,649 B2* | 12/2018 | Jang | C09K 11/00 |
| 10,436,973 B2 | 10/2019 | Wang et al. | |
| 10,446,782 B1 | 10/2019 | Han et al. | |
| 10,559,712 B2 | 2/2020 | Park et al. | |
| 10,717,649 B2* | 7/2020 | Jang | C09K 11/00 |
| 10,725,340 B2 | 7/2020 | Park et al. | |
| 10,732,458 B2 | 8/2020 | Jang et al. | |
| 10,954,440 B2 | 3/2021 | Won et al. | |
| 10,988,685 B2 | 4/2021 | Ahn et al. | |
| 11,326,097 B2* | 5/2022 | Lee | H10K 85/30 |
| 11,513,385 B2* | 11/2022 | Park | H10K 59/879 |
| 11,515,453 B2* | 11/2022 | Heiden | C09K 11/0883 |
| 11,530,354 B2 | 12/2022 | Kim et al. | |
| 11,866,630 B2* | 1/2024 | Kim | C09K 11/0883 |
| 2005/0102178 A1 | 5/2005 | Phillips et al. | |
| 2008/0138514 A1 | 6/2008 | Jang et al. | |
| 2010/0110728 A1 | 5/2010 | Dubrow et al. | |
| 2010/0283072 A1 | 11/2010 | Kazlas et al. | |
| 2011/0175059 A1 | 7/2011 | Kahen et al. | |
| 2012/0037883 A1* | 2/2012 | Jiang | H01L 25/0753 |
| | | | 257/13 |
| 2012/0113671 A1 | 5/2012 | Sadasivan et al. | |
| 2012/0113672 A1* | 5/2012 | Dubrow | B32B 5/16 |
| | | | 977/774 |
| 2013/0320370 A1* | 12/2013 | Schubert | H01L 33/405 |
| | | | 257/E33.072 |
| 2014/0339495 A1* | 11/2014 | Bibl | H01L 33/502 |
| | | | 257/13 |
| 2015/0176777 A1* | 6/2015 | Hikmet | F21V 14/003 |
| | | | 362/84 |
| 2015/0221619 A1* | 8/2015 | Rhee | H01L 33/486 |
| | | | 257/89 |
| 2016/0096992 A1* | 4/2016 | Guo | C09K 11/70 |
| | | | 423/299 |
| 2016/0167965 A1* | 6/2016 | Jang | C01B 19/007 |
| | | | 252/519.4 |
| 2016/0190105 A1* | 6/2016 | Rhee | H05B 33/145 |
| | | | 257/76 |
| 2016/0190515 A1* | 6/2016 | Huang | H10K 59/38 |
| | | | 257/13 |
| 2017/0059988 A1 | 3/2017 | Paek et al. | |
| 2017/0117444 A1* | 4/2017 | Stoll | H01L 33/504 |
| 2017/0306227 A1* | 10/2017 | Ippen | C09K 11/70 |
| 2017/0335187 A1 | 11/2017 | Guo et al. | |
| 2017/0346024 A1* | 11/2017 | Lee | H10K 30/35 |
| 2018/0094190 A1 | 4/2018 | Kim et al. | |
| 2018/0119007 A1* | 5/2018 | Ippen | H10K 50/115 |
| 2018/0151817 A1 | 5/2018 | Cho et al. | |
| 2018/0327665 A1* | 11/2018 | Lee | C09K 11/883 |
| 2019/0086733 A1* | 3/2019 | Min | G02B 6/0011 |
| 2019/0097101 A1* | 3/2019 | Dorman | H05B 45/20 |
| 2019/0112527 A1 | 4/2019 | Moriyama et al. | |
| 2019/0115492 A1* | 4/2019 | Tamma | H01L 33/20 |
| 2019/0198728 A1* | 6/2019 | Tamma | H05B 33/145 |
| 2019/0211262 A1* | 7/2019 | Park | G02F 1/133617 |
| 2019/0211265 A1 | 7/2019 | Park et al. | |
| 2019/0257003 A1* | 8/2019 | Kim | C09K 11/02 |
| 2019/0276734 A1 | 9/2019 | Kim et al. | |
| 2019/0276737 A1 | 9/2019 | Won et al. | |
| 2019/0280231 A1* | 9/2019 | Kim | C09K 11/02 |
| 2019/0348577 A1* | 11/2019 | Pathak | H01L 33/0075 |
| 2019/0348623 A1* | 11/2019 | Dohner | C09K 11/70 |
| 2020/0172802 A1 | 6/2020 | Ahn et al. | |
| 2020/0220043 A1 | 7/2020 | Park et al. | |
| 2020/0263083 A1 | 8/2020 | Kim et al. | |
| 2021/0066634 A1 | 3/2021 | Park et al. | |
| 2022/0119707 A1* | 4/2022 | Hwang | C01G 9/006 |
| 2022/0204843 A1* | 6/2022 | Jung | C09K 11/75 |
| 2022/0246804 A1* | 8/2022 | Park | C09K 11/565 |

FOREIGN PATENT DOCUMENTS

| | | |
|---|---|---|
| CN | 109244201 A | 1/2019 |
| CN | 109280960 A | 1/2019 |
| EP | 3536762 A1 | 9/2019 |
| KR | 100871961 B1 | 12/2008 |
| KR | 101165100 B1 | 7/2012 |
| KR | 1020140032811 A | 3/2014 |
| KR | 101460155 B1 | 11/2014 |
| KR | 1480475 B1 | 1/2015 |
| KR | 20150034621 A | 4/2015 |
| KR | 20180059363 A | 6/2016 |
| KR | 1668480 B1 | 10/2016 |
| KR | 101702000 B1 | 2/2017 |
| KR | 20170074585 A | 6/2017 |
| KR | 20180024363 A | 3/2018 |
| KR | 1020180033758 A | 4/2018 |
| KR | 20190003598 A | 1/2019 |
| KR | 20190106823 A | 9/2019 |
| KR | 1020190106819 A | 9/2019 |

OTHER PUBLICATIONS

Aqiang Wang et al., "Bright, efficient, and color-stable violet ZnSe-based quantum dot light-emitting diodes," Nanoscale, Jan. 5, 2015, pp. 2951-2959, vol. 7.

Extended European Search Report dated Mar. 9, 2021, of the corresponding European Patent Application No. 20202240.6.

(56) References Cited

OTHER PUBLICATIONS

Guozhi Jia, et al., Heterostructure Type Transformation of Ternary ZnTexSe1—x/ZnSe Core/ Shell Quantum Dots, Digest journal of nanomaterials and biostructures vol. 6, No. 1, 2011, pp. 43-53.

H Asano et al., "Synthesis of colloidal Zn(Te,Se) alloy quantum dots," Mater. Res. Express, Oct. 3, 2017, pp. 1-10, vol. 106501.

Hiroshi Asano et al., "Colloidal Zn(Te,Se)/ZnS Core/Shell Quantum Dots Exhibiting Narrow-Band and Green Photoluminescence," ACS Omega, Jun. 20, 2018, pp. 6703-6709, vol. 3.

Hiroshi Asano et al., ACS Omega (2018), Colloidal Zn(Te,Se)/ZnS Core/Shell Quantum Dots Exhibiting Narrow-Band and Green Photoluminescence.

Peter M. Ndangili, et al., Gallium-Induced Perturbation of Zinc Selenide Quantum Dots Electronics, Chemistry Select, vol. 2, No. 24, Aug. 22, 2017, pp. 7054-7062.

T. Maruyama et al., "Compensation centers in ZnSeTe," Journal of Applied Physics, Aug. 26, 1999, pp. 5993-5999, vol. 86, No. 11.

Vladimir Lesnyak et al., "One-step aqueous synthesis of blue-emitting glutathione-capped ZnSe1," Communication, Dec. 8, 2009, pp. 886-888, vol. 46.

Notice of Allowance dated Jan. 10, 2024 of the corresponding U.S. Appl. No. 18/318,053, 20 pp.

\* cited by examiner

Pattern Preparation by using a photoresist

Repeating the Patterning Process three times

CORE SHELL QUANTUM DOT, PRODUCTION METHOD THEREOF, AND ELECTRONIC DEVICE INCLUDING THE SAME

CROSS-REFERENCE TO RELATED APPLICATION

This is a continuation application that claims priority to U.S. patent application ser. no. 17/072,440 filed Oct. 16, 2020, which in turn claims priority to Korean Patent Application Nos. 10-2019-0129447 and 10-2020-0117036, which were filed in the Korean Intellectual Property Office on Oct. 17, 2019 and Sep. 11, 2020, respectively, and all the benefits accruing therefrom under 35 U.S.C. § 119, 120, the contents of which in their entirety is incorporated herein by reference.

BACKGROUND

1. Field

A core-shell quantum dot, a method of making the core shell quantum dot, and an electronic device including the core-shell quantum dot are disclosed.

2. Description of the Related Art

Unlike a bulk material, physical characteristics (e.g., energy bandgaps and melting points) of a semiconductor nanoparticle may be controlled by changing the size of the nanoparticle. For example, a semiconductor nanocrystal particle (also known as a quantum dot) is a crystalline material having a size in a range of several nanometers. Because the semiconductor nanocrystal particle has a relatively small size, the nanocrystal particle has a large surface area per a unit volume, and thereby, the particle exhibits a quantum confinement effect and will have different properties than bulk materials of the same chemical composition. A quantum dot may absorb energy from an excitation source, e.g., light or an applied electric current, and upon relaxation to the ground state the quantum dot emits light energy corresponding to a bandgap energy of the quantum dot.

SUMMARY

An embodiment provides a cadmium-free quantum dot capable of exhibiting enhanced, e.g., improved, optical properties such as a luminous efficiency and stability, e.g., oxidation stability.

An embodiment provides a method of producing the aforementioned cadmium-free quantum dot.

An embodiment provides a quantum dot composite including the aforementioned cadmium-free quantum dot.

An embodiment provides an electronic device, e.g., a display device, including the aforementioned cadmium-free quantum dot.

In an embodiment, a core shell quantum dot, hereinafter, at times, also referred to as quantum dot(s)) includes a core including a first semiconductor nanocrystal including zinc, tellurium, and selenium, and a semiconductor nanocrystal shell disposed on the core, the shell including a zinc chalcogenide,
wherein the quantum dot does not include cadmium, lead, mercury, or a combination thereof, and in an X-ray photoelectron spectrum of the quantum dot, a peak area for a Te oxide to a peak area for $Te3d_{5/2}$ as an area percentage is less than or equal to about 25%.

In the core shell quantum dot, a mole ratio of tellurium to selenium may be greater than or equal to about 0.1:1.

The mole ratio of tellurium to selenium may be greater than or equal to about 0.5:1, or greater than or equal to about 0.9:1.

In the core shell quantum dot, a mole ratio of tellurium to selenium may be greater than or equal to about 1:1, greater than or equal to about 1.1:1, or greater than or equal to about 1.2:1. The mole ratio of tellurium to selenium may be greater than or equal to about 1.3:1, or greater than or equal to about 1.5:1.

In the core shell quantum dot, a mole ratio of tellurium to selenium may be greater than or equal to about 1.9:1, greater than or equal to about 2:1, or greater than or equal to about 2.1:1.

The core shell quantum dot may have a mole ratio of tellurium to selenium that is less than or equal to about 4:1, less than or equal to about 3:1, or less than or equal to about 2.5:1.

In an X-ray photoelectron spectrum of the core shell quantum dot, the peak area for a Te oxide to a peak area for $Te3d_{5/2}$ is less than or equal to about 20%.

In an X-ray photoelectron spectrum of the core shell quantum dot, the peak area for Te oxide to a peak area for $Te3d_{5/2}$ as an area percentage is less than or equal to about 18%.

In an X-ray photoelectron spectrum of the core shell quantum dot, the peak area for Te oxide to a peak area for $Te3d_{5/2}$ as an area percentage is less than or equal to about 10%.

The core shell quantum dot may include additional metals, for example, aluminum, gallium, lithium, or a combination thereof.

The core shell quantum dot may be water-insoluble.

In the core of the core shell quantum dot, a mole ratio of tellurium to selenium may be greater than or equal to about 0.2:1, greater than or equal to about 0.5:1, greater than or equal to about 1:1, greater than or equal to about 1.5:1, or greater than or equal to about 2:1.

In the core of the core shell quantum dot, a mole ratio of tellurium to selenium may be less than or equal to about 5:1, less than or equal to about 4:1, less than or equal to about 3:1, less than or equal to about 2.5:1, or less than or equal to about 2:1.

The core of the core shell quantum dot may be a first semiconductor nanocrystal, and may include $ZnTe_xSe_{1-x}$ (wherein x is greater than or equal to about 0.4, or greater than or equal to about 0.5, and less than or equal to about 0.95, or less than or equal to about 0.9).

The shell of the core shell quantum dot may include a zinc chalcogenide, which may include selenium, sulfur, or a combination thereof.

In the core shell quantum dot, a mole ratio of sulfur to selenium (S/Se) may be greater than 0:1, greater than or equal to about 0.01:1, greater than or equal to about 0.02:1, greater than or equal to about 0.1:1, greater than or equal to about 0.5:1, greater than or equal to about 0.6:1, greater than or equal to about 0.7:1, greater than or equal to about 0.8:1, greater than or equal to about 0.9:1, or greater than or equal to about 1:1. In the core shell quantum dot, a mole ratio of sulfur to selenium (S:Se) may be less than or equal to about 4:1, less than or equal to about 3.5:1, less than or equal to about 3:1, less than or equal to about 2.5:1, less than or equal to about 2:1, less than or equal to about 1.5:1, less than or equal to about 1:1, or less than or equal to about 0.9:1.

A maximum photoluminescent peak of the core shell quantum dot may be at a wavelength of greater than about 450 nm, greater than about 460 nm, greater than about 470 nanometers (nm), greater than or equal to about 480 nm, greater than or equal to about 490 nm, or greater than or equal to about 500 nm.

A maximum photoluminescent peak of the core shell quantum dot may be at a wavelength of less than or equal to about 600 nm, for example, less than or equal to about 590 nm, less than or equal to about 580 nm, less than or equal to about 570 nm, or less than or equal to about 560 nm.

The maximum photoluminescent peak of the core shell quantum dot may have a wavelength in the range defined by any one minimum wavelength above and by any one maximum wavelength above, respectively. For example, a maximum luminescent peak wavelength of the core shell quantum dot is in a range of greater than about 450 nanometers and less than or equal to about 600 nanometers.

A maximum luminescent peak of the core shell quantum dot may have a full width at half maximum (FWHM) of less than about 50 nm, less than or equal to about 45 nm, less than or equal to about 40 nm, or less than or equal to about 30 nm.

The core shell quantum dot may have a quantum efficiency of greater than or equal to about 35%.

The core shell quantum dot may include an organic ligand and the organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', RHPO(OH), $RPO(OH)_2$, $R_2POOH$, a polymeric organic ligand, or a combination thereof, wherein R and R' are the same or different and are each independently a substituted or unsubstituted C1 to C40 aliphatic hydrocarbon group, a substituted or unsubstituted C6 to C40 aromatic hydrocarbon group, or a combination thereof.

The core shell quantum dot may further include gallium.

In an embodiment, a method of manufacturing the core shell quantum dot includes:

preparing a core particle by reacting a zinc precursor, a selenium precursor, and a tellurium precursor at a core formation temperature to form a nanocrystal;

adding a treating agent to a reaction medium including the nanocrystal for a post treatment, wherein the treating agent includes an organic thiol compound, a sulfur dispersed in a (C1 to C20 alkyl)phosphine, a bis(tri(C1 to C20 alkyl)silyl) sulfide, a metal compound (e.g., including zinc), or a combination thereof; and reacting a zinc precursor with a chalcogen element precursor at a shell formation temperature in the presence of the core particle and a shell formation organic ligand to form a semiconductor nanocrystal shell on the core particle.

In an embodiment, the semiconductor nanocrystal shell including zinc, and at least one of selenium and sulfur.

In an embodiment, the metal compound may include a metal halide, an organic metal compound or complex (e.g., an organic carboxylate-metal compound, an organic amine-metal compound, or a combination thereof), an organic-inorganic (complex) compound including a metal (e.g., a product obtained by a reaction between a metal carboxylate such as a metal oleate and a sulfur compound, for example, a thiol compound such as dodecane thiol, a S/TOP, or bis(trimethylsilyl) sulfide ($(TMSi)_2S$), or a combination thereof. The organic-inorganic compound may include a bond between the metal and sulfur.

The post treatment may be carried out at a temperature of greater than or equal to about 50° C. and less than or equal to about the core formation temperature. The post treatment may be carried out at a temperature of less than or equal to about 300° C., less than or equal to about 280° C., or less than or equal to about 200° C. The core formation temperature may be greater than or equal to about 280° C., or greater than or equal to about 300° C.

The shell formation temperature may be greater than or equal to about 250° C.

The thiol compound may have a C1 to C30 hydrocarbon group.

The metal halide may include a zinc chloride.

In an embodiment, a quantum dot composite includes a matrix (e.g., a polymer matrix); and a plurality of quantum dots dispersed in the matrix, wherein the plurality of quantum dots includes the aforementioned core-shell quantum dots. The polymer matrix may include a cross-linked polymer, a binder polymer including a carboxylic acid group, or a combination thereof.

The cross-linked polymer may include a polymerization product of a photopolymerizable monomer including a carbon-carbon double bond, a polymerization product of the photopolymerizable monomer and a multiple thiol compound having at least two thiol groups (e.g., at a terminal end of the multiple thiol compound), or a combination thereof.

The quantum dot composite may further include a metal oxide fine particle (e.g., dispersed in the matrix).

In an embodiment, a display device includes a light emitting element (e.g., a photoluminescent element) and optionally a light source, wherein the light emitting element includes the core shell quantum dots or a quantum dot-polymer composite that include the aforementioned core shell quantum dots. If present, the light source may be configured to provide the light emitting element with incident light.

The incident light may have a photoluminescence peak wavelength of about 440 nanometers (nm) to about 560 nm (or about 450 nm to about 460 nm).

The light emitting element may include a sheet of the quantum dot polymer composite.

The light emitting element may include a stacked structure including a substrate and a light emitting layer (e.g., a photoluminescent layer) disposed on the substrate. The light emitting layer may include a patterned quantum dot polymer composite. The pattern may include e.g., at least one, two, or three, repeating sections configured to emit light at a predetermined wavelength.

The display device may be configured to have color reproducibility of greater than or equal to about 80% based upon a BT2020 standard.

In another embodiment, the electronic device may include a first electrode and a second electrode each having a surface opposite the other, and an active layer including the core shell quantum dots, e.g., disposed between the first and the second electrodes.

The electronic device may further include a charge auxiliary layer (e.g., a hole auxiliary layer) disposed between the first electrode and the active layer.

The electronic device may further include a charge auxiliary layer (e.g., an electron auxiliary layer) disposed between the first electrode and the active layer.

In an embodiment, a cadmium free, core shell quantum dot capable of emitting light (e.g., emitting green light) with an improved, efficiency and a reduced FWHM at a desired wavelength (e.g., greater than about 470 nm) may be provided.

The core shell quantum dot of an embodiment may be applied to, e.g., used in, various display devices, biolabeling (biosensor, bioimaging), a photodetector, a solar cell, a hybrid composite, or the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1A:
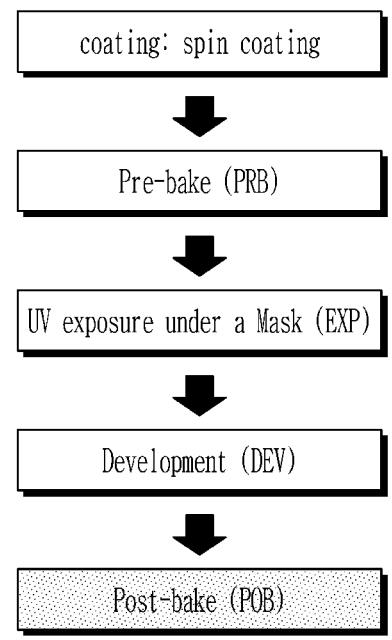
FIG. 1A schematically represents a process of producing a quantum dot composite pattern using a composition according to an embodiment.
Figure 1A:
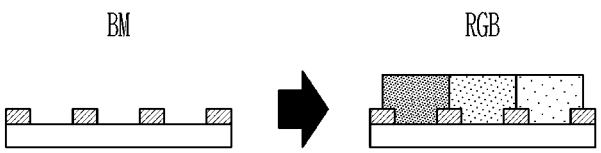

Advantages and characteristics of this disclosure, and a method for achieving the same, will become evident referring to the following example embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art.

Unless otherwise defined, all terms used in the specification (including technical and scientific terms) may be used with meanings commonly understood by a person having ordinary knowledge in the art. It will be further understood that terms, such as those defined in commonly dictionary should be interpreted as having a meaning that is consistent with their meaning in the context of the relevant art, and may not be interpreted ideally or exaggeratedly unless clearly defined. The terminology used herein is for the purpose of describing particular embodiments only and is not intended to be limiting.

As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" may refer to replacement of hydrogen of a compound or a group by a substituent of a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, a hydrocarbon group refers to a group including (or consisting of) carbon and hydrogen (e.g., an alkyl, alkenyl, alkynyl, or aryl group). The hydrocarbon group may be a group having a valence of one or greater formed by removal of a, e.g., at least one, hydrogen atom from alkane, alkene, alkyne, or arene. In the hydrocarbon group, a, e.g., at least one, methylene may be replaced by an oxide moiety, a carbonyl moiety, an ester moiety, —NH—, or a combination thereof.

Herein, "aliphatic" may refers to a saturated or unsaturated linear or branched hydrocarbon group. An aliphatic group may be an alkyl, alkenyl, or alkynyl group, for example.

As used herein, "alkyl" refers to a linear or branched saturated monovalent hydrocarbon group (methyl, ethyl, hexyl, etc.).

As used herein, "alkenyl" refers to a linear or branched monovalent hydrocarbon group having one or more carbon-carbon double bond.

As used herein, "alkynyl" refers to a linear or branched monovalent hydrocarbon group having one or more carbon-carbon triple bond.

Herein, "aromatic" refers to an organic compound or group comprising a, e.g., at least one, unsaturated cyclic group having delocalized pi electrons. The term encompasses both hydrocarbon aromatic compounds and heteroaromatic compounds.

As used herein, "aryl" refers to a group formed by removal of a, e.g., at least one, hydrogen from an aromatic hydrocarbon (e.g., a phenyl or naphthyl group).

As used herein, "hetero" refers to one including one or more (e.g., 1 to 3) heteroatom of N, O, S, Si, P, or a combination thereof.

As used herein, the wording "Group" refers to a group of Periodic Table.

As used herein, "Group III" may refer to Group IIIA and Group IIIB, and examples of Group III metal may be In, Ga, and Tl, but are not limited thereto.

As used herein, "Group V" may refer to Group VA, and examples may include nitrogen, phosphorus, arsenic, antimony, and bismuth, but are not limited thereto.

The term "average" used in this disclosure (e.g., an average size of the quantum dot) may be a mean or a median. In an embodiment, the average may be a "mean" average.

As used herein, the quantum efficiency may be a relative quantum yield or an absolute quantum yield that can be readily measured by any commercially available equipment. The quantum efficiency (or quantum yield) may be measured in a solution state or a solid state (as in a composite). In an embodiment, "quantum yield (or quantum efficiency)" may be a ratio of photons emitted to photons absorbed by the quantum dot composite, e.g., by a nanostructure or population of nanostructures. In an embodiment, the quantum efficiency may be determined by any method known to those of ordinary skill in the art. For example, quantum efficiency may be measured by an absolute method and a relative method. The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on the photoluminescent wavelengths, but are not limited thereto.

The quantum yield (QY) may be readily and reproducibly determined by using commercially available equipment, for example, from Hitachi Co. Ltd or Hamamatsu Co. Ltd and referring to the instruction manuals provided from the manufacturer.

The FWHM and the maximum PL peak wavelength may be determined by a photoluminescent spectrum obtained by a spectrophotometer (or Fluorescence Spectrophotometer).

As used herein, the expression "not including cadmium (or other harmful heavy metal)" may refer to the case in which a concentration of each of cadmium (or another heavy metal deemed harmful, see below) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other heavy metal) may be present or, if present, an amount of cadmium (or other heavy metal) may be less than or equal to a detection limit or as an impurity level of a given analysis tool (e.g., an inductively coupled plasma atomic emission spectroscopy).

Semiconductor nanocrystal particles (e.g., a quantum dots) may absorb light from an excitation source and may emit light corresponding to an energy bandgap of the quantum dots. The energy bandgap of the quantum dot may vary with the size and the composition of the quantum dot. For example, as the size of the quantum dot increases, the quantum dot may have a narrower energy bandgap and may exhibit an increased light emitting wavelength. Semiconductor nanocrystals may be used as a light emitting material in various fields such as a display device, an energy device, or a bio light emitting device.

Quantum dots having relatively increased photoluminescence properties may include a toxic heavy metal such as cadmium (Cd), lead (Pb), and/or mercury (Hg). The toxic heavy metal such as cadmium may cause environmental issues, health issues, or a combination thereof and is one of the restricted elements under Restriction of Hazardous Substances Directive (RoHS) in many countries. Accordingly, development of a cadmium-free quantum dot having improved photoluminescence characteristics is desired. A cadmium free indium phosphide quantum dot (QD) may be applied, e.g., in an actual device.

In order to be applied to, e.g., used in, a quantum dot display device (e.g., including a color conversion layer including the quantum dot) and to realize a display device having a relatively high color reproducibility under a next generation color standard such as BT2020, a quantum dot having a relatively narrow full width at half maximum (FWHM) is desired. For example, in order for a device to achieve an enhanced, e.g., improved, color reproducibility under the BT2020 standard, a luminous material used therein may be desired to have a reduced level of a FWHM. However, in comparison with a Cd based core (e.g., a CdSe core), a Group III-V compound based quantum dot including indium and phosphorus has a smaller bandgap and a larger Bohr radius and thus changes in the FWHM depending on a size of the quantum dot may be significant. Accordingly, the InP based quantum dot may not have the desired FWHM of emitted light at a desired wavelength (e.g., greater than about 470 nm, greater than or equal to about 475 nm, greater than or equal to about 480 nm, and less than or equal to about 580 nm). In addition, the core including indium and phosphorus may be susceptible to surface oxidation and a quantum dot including the same may have an increased FWHM when including a shell, e.g., a shell is coated on a core of the quantum dot, and thus it may be difficult to achieve a quantum efficiency of a desired level together with a desired FWHM.

The present inventors have found that as a cadmium free quantum dot, a ZnTeSe based nanocrystal particle may have a desired FWHM and emit light of a desired wavelength (e.g., greater than about 470 nm, greater than or equal to about 475 nm, greater than or equal to about 480 nm, and less than or equal to about 580 nm. Moreover, the inventors in their research found that such emission is not really as dependent upon average particle size of the quantum dot, in comparison with an indium phosphide based quantum dot or a cadmium based quantum dot. In other words, the ZnTeSe nanocrystal particle may be advantageous in that it may exhibit a small change in (or relatively narrow) FWHM at a maximum luminous wavelength even if the average particle size change in a population of the quantum dots is relatively large.

However, it may be difficult for a quantum dot structure including a ZnTeSe based core and an inorganic shell coated thereon to exhibit a desired luminous property. Without wishing to be bound any theory, according to the research of the present inventors, it is believed that a zinc telluride based core is very susceptible to oxidation of tellurium during a shell formation. Without wishing to be bound any theory, it is believed that the formation of an inorganic shell (such as an inorganic shell including a zinc chalcogenide) over the ZnTeSe core may entail a substantial amount of an oxide (e.g., a tellurium oxide), which may be primarily formed after the formation of the core nanocrystal and before the full formation of the shell.

A core shell quantum dot of an embodiment, and a method of making the quantum dot will be described in detail below. In the method of an embodiment, a treating agent is added during core formation, and thereby, a ligand having an increased binding to the core is introduced and this can minimize a reaction (e.g., oxidation) of the core if exposed to oxygen when the core is stored or is subjected to a shell formation process.

In an embodiment, the core shell quantum dot(s) includes a core including a first semiconductor nanocrystal including zinc, tellurium, and selenium, and a semiconductor nanocrystal shell including a zinc chalcogenide disposed on the core (or at least a portion of a surface of the core).

The core shell quantum dot of the embodiment does not include cadmium, lead, mercury, or a combination thereof, and in an X-ray photoelectron spectroscopy spectrum thereof, a peak area for Te oxide (e.g., TeO, $TeO_2$, $TeO_3$, or a combination thereof) to a peak area for $Te3d_{5/2}$ as an area percentage is less than or equal to about 25 percent (%). The peak of the Te oxide may refer to an oxide peak adjacent to Te $3d_{5/2}$.

The core-shell quantum dot (or the core) may include tellurium in a predetermined amount. An amount of elemental components included in the quantum dot as described herein may be determined through an appropriate analytical instrument and methods well known to those of ordinary skill (e.g., an inductively coupled plasma atomic emission spectroscopy (ICP-AES), X-ray photoelectron spectroscopy (XPS), ion chromatography, Transmission electron microscopy energy-dispersive X-ray spectroscopy (TEM-EDS), or the like).

The core may have a structure wherein selenium is alloyed (doped) in a zinc telluride crystal. In the core or in the core shell quantum dot, an amount of the tellurium may be greater than that of the selenium.

In the core shell quantum dot of an embodiment, the core may include a first semiconductor nanocrystal including zinc, tellurium, and selenium. The first semiconductor nanocrystal may include $ZnTe_xSe_{1-x}$ (wherein x is greater than or equal to about 0.12, greater than or equal to about 0.15, greater than or equal to about 0.17, greater than or equal to about 0.2, greater than or equal to about 0.3, greater than or equal to about 0.4, greater than or equal to about 0.5, greater than or equal to about 0.51, greater than or equal to about 0.52, greater than or equal to about 0.53, greater than or equal to about 0.54, greater than or equal to about 0.55, greater than or equal to about 0.56, greater than or equal to about 0.57, greater than or equal to about 0.58, greater than or equal to about 0.59, greater than or equal to about 0.6, greater than or equal to about 0.61, greater than or equal to about 0.62, greater than or equal to about 0.63, greater than or equal to about 0.64, greater than or equal to about 0.65, greater than or equal to about 0.66, greater than or equal to about 0.67, greater than or equal to about 0.68, greater than or equal to about 0.69, greater than or equal to about 0.70, greater than or equal to about 0.71, greater than or equal to about 0.72, greater than or equal to about 0.73, greater than or equal to about 0.74, greater than or equal to about 0.75, or greater than or equal to about 0.8; and less than or equal to about 0.9, less than or equal to about 0.89, less than or equal to about 0.88, less than or equal to about 0.87, less than or equal to about 0.86, less than or equal to about 0.85, less than or equal to about 0.84, less than or equal to about 0.83, less than or equal to about 0.82, less than or equal to about 0.8, less than or equal to about 0.75, less than or equal to about 0.7, less than or equal to about 0.65, or less than or equal to about 0.6.

In the core, a mole ratio of tellurium to selenium (Te:Se) may be greater than or equal to about 0.2:1, greater than or equal to about 0.25:1, greater than or equal to about 0.3:1, greater than or equal to about 0.35:1, greater than or equal to about 0.4:1, greater than or equal to about 0.45:1, greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.8:1, greater than or equal to about 0.85:1, greater than or equal to about 0.9:1, greater than or equal to about 0.93:1, greater than or equal to about 0.95:1, greater than or equal to about 1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.2:1, greater than or equal to about 2.3:1, greater than or equal to about 2.4:1, greater than or equal to about 2.5:1, greater than or equal to about 2.6:1, greater than or equal to about 2.7:1, greater than or equal to about 2.8:1, greater than or equal to about 2.9:1, or greater than or equal to about 3:1.

In the core, a mole ratio of tellurium to selenium (Te:Se) may be less than or equal to about 5:1, less than or equal to about 4.5:1, less than or equal to about 4:1, less than or equal to about 3.9:1, less than or equal to about 3.8:1, less than or equal to about 3.7:1, less than or equal to about 3.6:1, less than or equal to about 3.5:1, less than or equal to about 3.4:1, less than or equal to about 3.3:1, less than or equal to about 3.2:1, less than or equal to about 3.1:1, less than or equal to about 3:1, less than or equal to about 2.9:1, less than or equal to about 2.8:1, less than or equal to about 2.7:1, less than or equal to about 2.6:1, less than or equal to about 2.5:1, less than or equal to about 2.4:1, less than or equal to about 2.3:1, less than or equal to about 2.2:1, less than or equal to about 2.1:1, less than or equal to about 2.0:1, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, less than or equal to about 1.2:1, less than or equal to about 1.1:1, less than or equal to about 1:1, less than or equal to about 0.9:1, less than or equal to about 0.8:1, less than or equal to about 0.7:1, less than or equal to about 0.6:1, less than or equal to about 0.5:1, or less than or equal to about 0.4:1.

In a core shell quantum dot of an embodiment, a mole ratio of tellurium to selenium (Te:Se) may be greater than about 0.05:1, for example, greater than or equal to about 0.055:1, greater than or equal to about 0.06:1, greater than or equal to about 0.065:1, or greater than or equal to about 0.07:1.

In the core shell quantum dot of an embodiment, a mole ratio of tellurium to selenium (Te:Se) may be greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.45:1, greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.8:1, greater than or equal to about 0.85:1, greater than or equal to about 0.9:1, or greater than or equal to about 0.95:1, greater than or equal to about 1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.2:1, greater than or equal to about 2.3:1, greater than or equal to about 2.4:1, greater than or equal to about 2.5:1, greater than or equal to about 2.6:1, greater than or equal to about 2.7:1, greater than or equal to about 2.8:1, greater than or equal to about 2.9:1, or greater than or equal to about 3:1.

In the core shell quantum dot an embodiment, a mole ratio of tellurium to selenium may be less than or equal to about 4:1, less than or equal to about 3.9:1, less than or equal to about 3.8:1, less than or equal to about 3.7:1, less than or equal to about 3.6:1, less than or equal to about 3.5:1, less than or equal to about 3.4:1, less than or equal to about 3.3:1, less than or equal to about 3.2:1, less than or equal to about 3.1:1, less than or equal to about 3:1, less than or equal to about 2.9:1, less than or equal to about 2.8:1, less than or equal to about 2.7:1, less than or equal to about 2.6:1, less than or equal to about 2.5:1, or less than or equal to about 2.4:1, less than or equal to about 2.3:1, less than or equal to about 2.2:1, less than or equal to about 2.1:1, less than or equal to about 2.0:1, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, less than or equal to about 1.2:1, less than or equal to about 1.1:1, less than or equal to about 1:1, less than or equal to about 0.9:1, less than or equal to about 0.8:1, less than or equal to about 0.7:1, less than or equal to about 0.6:1, less than or equal to about 0.5:1, less than or equal to about 0.4:1, less than or equal to about 0.3:1, or less than or equal to about 0.2:1.

As determined by an inductively coupled plasma atomic emission spectroscopy analysis, in a core shell quantum dot of an embodiment, a mole ratio of tellurium with respect to zinc (Te:Zn) may be greater than about 0.03:1. In a core shell quantum dot an embodiment, a mole ratio of tellurium with respect to zinc (Te:Zn) may be greater than or equal to about 0.05:1, greater than or equal to about 0.07:1, greater than or equal to about 0.09:1, greater than or equal to about 0.1:1, greater than or equal to about 0.13:1, greater than or equal to about 0.15:1, greater than or equal to about 0.17:1, greater than or equal to about 0.19:1, greater than or equal to about 0.2:1, greater than or equal to about 0.21:1, greater than or equal to about 0.23:1, greater than or equal to about 0.25:1, greater than or equal to about 0.3:1, greater than or equal to about 0.35:1, or greater than or equal to about 0.4:1 (for example, when being determined by an inductively coupled plasma atomic emission spectroscopy analysis).

In a core shell quantum dot of an embodiment, a mole ratio of tellurium to zinc (Te:Zn) may be less than about 1:1, for example, less than or equal to about 0.9:1, less than or equal to about 0.8:1, less than or equal to about 0.7:1, less than or equal to about 0.6:1, less than or equal to about 0.5:1, less than or equal to about 0.4:1, less than or equal to about 0.3:1, less than or equal to about 0.2:1, or less than or equal to about 0.1:1 (for example, as determined by an inductively coupled plasma atomic emission spectroscopy analysis).

In a core shell quantum dot of an embodiment, a mole ratio of zinc to tellurium (Zn:Te) may be greater than or equal to about 0.5:1, greater than or equal to about 1:1, greater than or equal to about 1.1:1, greater than or equal to about 1.5:1, greater than or equal to about 2:1, greater than or equal to about 3:1, greater than or equal to about 4:1 and less than or equal to about 40:1, less than or equal to about 35:1, less than or equal to about 30:1, less than or equal to about 25:1, less than or equal to about 20:1, less than or equal to about 15:1, less than or equal to about 10:1, less than or equal to about 6:1, less than or equal to about 4:1, less than or equal to about 3:1, less than or equal to about 2.5:1, less than or equal to about 2.4:1, less than or equal to about 2.3:1, or less than or equal to about 2.25:1.

A core shell quantum dot of an embodiment may further include sulfur. In an embodiment, a mole ratio of sulfur to zinc may be greater than or equal to about 0.05:1, greater than or equal to about 0.1:1, greater than or equal to about 0.15:1, greater than or equal to about 0.2:1, greater than or equal to about 0.25:1, greater than or equal to about 0.3:1, or greater than or equal to about 0.35:1 and less than or equal to about 0.95:1, less than or equal to about 0.9:1, less than or equal to about 0.85:1, less than or equal to about 0.8:1, less than or equal to about 0.75:1, less than or equal to about 0.7:1, less than or equal to about 0.65:1, less than or equal to about 0.6:1, less than or equal to about 0.5:1, less than or equal to about 0.4:1, or less than or equal to about 0.3:1.

In core shell quantum dot of an embodiment, a mole ratio of sulfur to tellurium (S/Te) may be greater than 0, greater than or equal to about 0.1:1, greater than or equal to about 0.2:1, greater than or equal to about 0.3:1, greater than or equal to about 0.4:1, greater than or equal to about 0.45:1, greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.8:1, greater than or equal to about 0.85:1, or greater than or equal to about 0.9:1 and less than or equal to about 8:1, less than or equal to about 7:1, less than or equal to about 6:1, less than or equal to about 5:1, less than or equal to about 4.5:1, less than or equal to about 4:1, less than or equal to about 3.5:1, less than or equal to about 3:1, less than or equal to about 2.5:1, less than or equal to about 2:1, less than or equal to about 1.5:1, less than or equal to about 1:1, less than or equal to about 0.9:1, less than or equal to about 0.8:1, less than or equal to about 0.7, less than or equal to about 0.6:1, less than or equal to about 0.5:1, or less than or equal to about 0.4.

In the core shell quantum dot of an embodiment, or in the core of an embodiment (or the first semiconductor nanocrystal), a mole ratio of selenium to tellurium (Se:Te) may be greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.8:1, greater than or equal to about 0.85:1, greater than or equal to about 0.9:1, greater than or equal to about 0.95:1, greater than or equal to about 1:1, greater than or equal to about 1.5:1, greater than or equal to about 2:1, greater than or equal to about 2.5:1, greater than or equal to about 3:1, greater than or equal to about 3.5:1, greater than or equal to about 4:1, greater than or equal to about 4.5:1, greater than or equal to about 5:1, or greater than or equal to about 5.5:1.

In the core shell quantum dot of an embodiment, or in the core of an embodiment (the first semiconductor nanocrystal), a mole ratio of selenium to tellurium (Se:Te) may be less than or equal to about 7:1, less than or equal to about 6.5:1, less than or equal to about 6:1, less than or equal to about 5.5:1, less than or equal to about 5:1, less than or equal to about 4.5:1, less than or equal to about 4:1, less than or equal to about 3.5:1, less than or equal to about 3:1, less than or equal to about 2.5:1, less than or equal to about 2:1, less than or equal to about 1.5:1, less than or equal to about 1:1, less than or equal to about 0.9:1, less than or equal to about 0.85:1, less than or equal to about 0.8:1, less than or equal to about 0.7:1, less than or equal to about 0.6:1, less than or equal to about 0.5:1, or less than or equal to about 0.45:1.

In the core shell quantum dot of an embodiment, a mole ratio of a sum of sulfur and selenium to tellurium ((Se+S)/Te) may be less than or equal to about 15:1, less than or equal to about 14:1, less than or equal to about 13:1, less than or equal to about 12:1, less than or equal to about 11:1, less than or equal to about 10:1, less than or equal to about 9:1, less than or equal to about 8:1, less than or equal to about 7:1, less than or equal to about 6:1, less than or equal to about 5:1, less than or equal to about 4:1, or less than or equal to about 3:1. In the core shell quantum dot of an embodiment, a mole ratio of a sum of sulfur and selenium to tellurium may be greater than or equal to about 1:1, greater than or equal to about 1.5:1, or greater than or equal to about 2:1.

The core shell quantum dot may not include manganese, copper, or a combination thereof. The quantum dot may not include a Group III-V compound. The Group III-V compound may include an indium phosphide, an indium zinc phosphide, a gallium phosphide, or a combination thereof. The core shell quantum dot may not exhibit a peak assigned to the group III-V compound (e.g., an indium phosphide or a gallium phosphide) in an X-ray diffraction analysis.

The core shell quantum dot of an embodiment may further include gallium, aluminum, lithium, or a combination thereof, for example, in the core, the semiconductor nanocrystal shell, or in both the core and the shell. For instance, in an embodiment, the semiconductor nanocrystal shell may not include gallium, aluminum, lithium, or a combination thereof. In another embodiment, the semiconductor nanocrystal shell may include gallium, aluminum, lithium, or a combination thereof.

In core shell quantum dot(s) of an embodiment, if present, a mole ratio of gallium, aluminum, lithium, or a combination thereof, to tellurium may be greater than or equal to about 0.005:1, greater than or equal to about 0.009:1, greater than or equal to about 0.01:1, greater than or equal to about 0.02:1, greater than or equal to about 0.03:1, greater than or equal to about 0.04:1, greater than or equal to about 0.05:1, greater than or equal to about 0.06:1, greater than or equal to about 0.07:1, greater than or equal to about 0.08:1, greater than or equal to about 0.09:1, greater than or equal to about 0.1:1, greater than or equal to about 0.11:1, greater than or equal to about 0.12:1, greater than or equal to about 0.13:1, greater than or equal to about 0.14:1, greater than or equal to about 0.15:1, greater than or equal to about 0.16:1, greater than or equal to about 0.17:1, greater than or equal to about 0.18:1, greater than or equal to about 0.19:1, greater than or equal to about 0.2:1, greater than or equal to about 0.21:1, greater than or equal to about 0.22:1, greater than or equal to about 0.23:1, greater than or equal to about 0.24:1, greater than or equal to about 0.25:1, greater than or equal to about 0.26:1, greater than or equal to about 0.27:1, greater than or equal to about 0.28:1, greater than or equal to about 0.29:1, greater than or equal to about 0.3:1, greater than or equal to about 0.31:1, greater than or equal to about 0.32:1, greater than or equal to about 0.33:1, greater than or equal to about 0.34:1, greater than or equal to about 0.35:1, greater than or equal to about 0.36:1, greater than or equal to about 0.37:1, greater than or equal to about 0.38:1, greater than or equal to about 0.39:1, greater than or equal to about 0.4:1, greater than or equal to about 0.41:1, greater than or equal to about 0.42:1, greater than or equal to about 0.43:1, greater than or equal to about 0.44:1, greater than or equal to about 0.45:1, greater than or equal to about 0.46:1, greater than or equal to about 0.47:1, greater than or equal to about 0.48:1, greater than or equal to about 0.49:1, or greater than or equal to about 0.50:1.

In core shell quantum dot(s) of an embodiment, if present, a mole ratio of gallium, aluminum, lithium, or a combination thereof, to tellurium may be less than or equal to about 1.5:1, less than or equal to about 1:1, less than or equal to about 0.9:1, less than or equal to about 0.85:1, less than or equal to about 0.8:1, less than or equal to about 0.75:1, less than or equal to about 0.7:1, less than or equal to about 0.65:1, less than or equal to about 0.6:1, or less than or equal to about 0.55:1.

Without wishing to be bound by any theory, the presence of the gallium, aluminum, and/or lithium may contribute to enhanced luminous properties of the core shell quantum dot.

In an embodiment, the semiconductor nanocrystal shell may include zinc, and at least one of selenium (Se) or sulfur (S) (e.g., sulfur, selenium, or a combination thereof). The semiconductor nanocrystal shell may be ZnSe, ZnS, ZnSeS, or a combination thereof.

The semiconductor nanocrystal shell may be a multi-layered shell including a plurality of layers. In the plurality of layers of the shell, adjacent layers may have semiconductor nanocrystal material of different compositions. The multi-layered shell may include a first shell layer disposed directly on the core and a second shell layer disposed on or over the first layer. The first shell layer may include a second semiconductor nanocrystal. The second shell layer may include a third semiconductor nanocrystal having a composition different from the second semiconductor nanocrystal. The second shell layer may be the outermost shell layer of the core shell quantum dot. The second semiconductor nanocrystal may include zinc and selenium, and optionally sulfur. The second semiconductor nanocrystal may not include sulfur. The third semiconductor nanocrystal may include zinc and sulfur. The third semiconductor nanocrystal may not include selenium. In an embodiment, the first shell layer may include ZnSe, ZnSeS, ZnS, or a combination thereof. The second shell layer may consist of ZnS.

In a multi-layered shell, a thickness of each shell layer may be selected appropriately. The thickness of the shell layer may be greater than or equal to about 1 monolayer (ML), for example, greater than or equal to about 2 ML, greater than or equal to about 3 ML, greater than or equal to about 4 ML, greater than or equal to about 5 ML and less than or equal to about 10 ML, for example, less than or equal to about 9 ML, less than or equal to about 8 ML, less than or equal to about 7 ML, less than or equal to about 6 ML, or less than or equal to about 5 ML. The thickness of each shell layer in the multi-layered shell may be selected taking into consideration a desired composition of a final core shell quantum dot.

In an embodiment, the shell or each of the shell layers in the multi-layered shell may include a gradient alloy having a composition varying in a direction of a radius, e.g., a radial direction from the core toward an outermost surface of the core shell quantum dot. In an embodiment, an amount of the sulfur in the semiconductor nanocrystal shell may increase toward a surface of the core shell quantum dot. For example, in the shell, the amount of the sulfur may increase in a direction away from the core, e.g., in a radial direction from the core toward an outermost surface of the core shell quantum dot.

In the core shell quantum dot of an embodiment, an amount of the tellurium oxide may be substantially reduced or kept under control and limited. Without wishing to be bound by any theory, the core shell quantum dot of an embodiment may be prepared by using the core prepared by the method that will be described in detail below (e.g., with the inclusion of the treating agent prior to shell formation), and optionally by controlling the preparative conditions of shell formation, the formation of tellurium oxide in the core may be suppressed.

Accordingly, the core shell quantum dot of an embodiment may exhibit substantially no amount of tellurium oxide or very limited amount thereof as determined by an XPS. In the core shell quantum dot of the embodiment, an amount of the tellurium oxide may be determined by the XPS analysis and quantified by the measurement of peak area in the spectrum.

In the XPS spectrum, each of peak areas (or intensities) can be readily and reproducibly measured therefrom, for example, by using a software for the analysis of XPS spectra such as "XPSPEAK 4.1" or a software provided with an equipment for the XPS analysis.

In the XPS analysis of the core shell quantum dot, a peak area of the Te oxide peak to the peak area of Te $3d_{5/2}$ as an area percentage (see, below) may be less than or equal to about 25%, less than or equal to about 20%, less than or equal to about 19%, less than or equal to about 18%, less than or equal to about 17%, less than or equal to about 16%, less than or equal to about 15%, less than or equal to about 14%, less than or equal to about 13%, less than or equal to about 12%, less than or equal to about 11%, or less than or equal to about 10%.

area percentage=[peak area(tellurium oxide)/peak area(Te$3d_{5/2}$(Zn—Te))]×100

According to the research of the present inventors, the amount of the Te oxide as determined by the XPS analysis may substantially affect the luminous properties (e.g., quantum efficiency) of the core shell quantum dots, and in order to achieve a desired level of the luminous properties, the amount of the Te oxide may necessarily be controlled by the preparative methods of core shell quantum dots developed by the inventors and described herein.

The X-ray photoelectron spectroscopy is a tool that can be used to identify or characterize a photoelectron that is emitted or ejected from a material (compound, metal compound, or metal alloy) following irradiation of the material with an X-ray. Specifically, the material is irradiated with an X-ray and an energy of a photoelectron emitted from the solid sample is measured. The emitted photoelectron may provide information about binding energy of a core electron of a given element in the material.

The XPS is a non-destructive measurement technology that can provide information about the state of the electrons and the material composition. In addition, XPS, may be used to provide a relative concentration of an element in a material, and in some instances, the concentration can be measured quantitatively. The binding energy of the core electrons is an inherent property of an element, and thus, the results of the XPS may provide the information about the elements constituting the provided material sample and the composition and the binding state of the material sample. XPS is a well-established analytical tool in the art of material analysis, e.g., semiconductor materials, and such methods of measurement are commercially available and known to readily provide results with desirable precision or reproducibility. Moreover, XPS can provide a spectrum enlarged for an element of interest (i.e., tellurium) to obtain a multiplex spectrum and this can provide additional information. In an embodiment, the core shell quantum dot is subjected to an XPS analysis of tellurium (e.g., for Te $3d_{5/2}$) and from a high resolution peak scan one can obtain quantitative analytic information of a tellurium oxide with respect to amounts of tellurium in a material sample.

An excitation source for the XPS analysis may include monochromatic and focused Al Kα source (E=1486.6 eV) but is not limited thereto.

In case of the Te, the zinc chalcogenide, and the Te oxide may exhibit peaks at different positions, respectively. In an embodiment, the tellurium of the ZnTe or ZnTeSe may show a peak at around 572 eV (e.g., 572.7 eV), whereas the Te oxide may exhibit peaks at a position higher than that of the Te of the zinc chalcogenides (e.g., about 575 eV to about 577 eV) (e.g., 575.6 eV, 576.2 eV or 577.3 eV). The Te $3d_{5/2}$ peaks may be fitted with a single mixed Gaussian plus Lorentzian and its background may be subtracted with Shirley background.

A ZnTe based core (or a ZnTe$_x$Se$_{(1-x)}$ based alloy core) may provide a core shell quantum dot that can emit light of a desired wavelength, for example, a wavelength of less than or equal to about 600 nm, or less than or equal to about 580 nm and greater than or equal to about 490 nm, or greater than or equal to about 500 nm, even without inclusion of a toxic heavy metal.

However, from the research of the present inventors, shell formation on such a core may not provide a final core shell quantum dot of desired luminous properties such as luminescent wavelength and luminous efficiency (in particular, as the core has relatively greater amounts of tellurium). Without wishing to be bound by any theory, a Group II-VI compound core including the tellurium may have poor oxidation stability, and thus, during the shell formation oxidation of the tellurium may occur, which may have an adverse effect on the optical properties of the resulting core shell quantum dots.

In contrast, the core shell quantum dots prepared in the following method may include a relatively small amount, or substantially no amount of tellurium oxide, as measured by the XPS analysis. Accordingly, the core shell quantum dots of the embodiment may exhibit one or more improved optical properties (e.g., an increased quantum efficiency).

The core shell quantum dot (or a plurality thereof) may have a (an average) particle size of greater than or equal to about 2 nanometers (nm), greater than or equal to about 3 nm, greater than or equal to about 4 nm, greater than or equal to about 5 nm, greater than or equal to about 6 nm, greater than or equal to about 7 nm, greater than or equal to about 7.5 nm, greater than or equal to about 8 nm, greater than or equal to about 8.5 nm, greater than or equal to about 9 nm, greater than or equal to about 9.5 nm, or greater than or equal to about 10 nm.

A size (or an average size) of the core shell quantum dot (or a plurality thereof) may be less than or equal to about 50 nm, for example, less than or equal to about 45 nm, less than or equal to about 40 nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, less than or equal to about 10 nm, less than or equal to about 9 nm, less than or equal to about 8 nm, less than or equal to about 7 nm, less than or equal to about 6 nm, or less than or equal to about 5 nm. As used herein, the size of the quantum dot may refer to a diameter or an equivalent diameter obtained from a two-dimensional image of an electron microscopy analysis (e.g., under an assumption of a circle). As used herein, "a size" may refer to a size of a single quantum dot or a (e.g., mean or median) average of quantum dots or a plurality of quantum dots. A size of the quantum dot(s) may be determined by using a result (e.g., an image) a (transmission) electron microscopy analysis and any commercially available image analysis computer program (e.g. Image J).

In a core shell quantum dot of an embodiment, a size (or an average size) of the core(s) may be greater than or equal to about 1 nm, for example, greater than or equal to about 2 nm, greater than or equal to about 2.5 nm, greater than or equal to about 3 nm, greater than or equal to about 3.5 nm, greater than or equal to about 4 nm, or greater than or equal to about 4.5 nm. A size (or an average size) of the core(s) may be less than or equal to about 7 nm, less than or equal to about 6 nm, less than or equal to about 5 nm, less than or equal to about 4 nm, less than or equal to about 3 nm, or less than or equal to about 2 nm.

The first absorption peak of the core shell quantum dot may be present in a wavelength range of greater than or equal to about 370 nm, greater than or equal to about 375 nm, greater than or equal to about 380 nm, greater than or equal to about 385 nm, greater than or equal to about 390 nm, greater than or equal to about 395 nm, greater than or equal to about 400 nm, greater than or equal to about 405 nm, greater than or equal to about 410 nm, greater than or equal to about 420 nm, greater than or equal to about 430 nm, greater than or equal to about 440 nm, greater than or equal to about 450 nm, greater than or equal to about 460 nm, greater than or equal to about 465 nm, greater than or equal to about 470 nm, greater than or equal to about 475 nm, greater than or equal to about 480 nm.

The first absorption peak of the core shell quantum dot may be present in a wavelength range of less than or equal to about 530 nm, less than or equal to about 525 nm, less than or equal to about 520 nm, less than or equal to about 515 nm, less than or equal to about 510 nm, less than or equal to about 505 nm, less than or equal to about 500 nm, less than or equal to about 495 nm, less than or equal to about 490 nm, less than or equal to about 485 nm, less than or equal to about 480 nm, less than or equal to about 475 nm, less than or equal to about 465 nm, less than or equal to about 460 nm, less than or equal to about 455 nm, less than or equal to about 450 nm, or less than or equal to about 445 nm.

In comparison with other quantum dots based on Zn, Te, and Se, the core shell quantum dots of an embodiment may exhibit improved quantum efficiency, for example, a quantum efficiency that is greater than or equal to about 10%. The core shell quantum dots of an embodiment may emit light at a quantum efficiency of greater than or equal to about 11%, greater than or equal to about 12%, greater than or equal to about 13%, greater than or equal to about 14%, greater than or equal to about 15%, greater than or equal to about 16%, greater than or equal to about 17%, greater than or equal to about 18%, greater than or equal to about 19%, greater than or equal to about 20%, greater than or equal to about 21%, greater than or equal to about 22%, greater than or equal to about 23%, greater than or equal to about 24%, greater than or equal to about 25%, greater than or equal to about 26%, greater than or equal to about 27%, greater than or equal to about 28%, greater than or equal to about 29%, greater than or equal to about 30%, greater than or equal to about 35%, greater than or equal to about 40%, greater than or equal to about 45%, or greater than or equal to about 50%.

A maximum photoluminescent peak wavelength of the core shell quantum dot may be present in a range of greater than or equal to about 450 nm, greater than or equal to about 455 nm, greater than or equal to about 460 nm, greater than or equal to about 465 nm, greater than or equal to about greater than about 470 nm, for example, greater than or equal to about 471 nm, greater than or equal to about 472 nm, greater than or equal to about 473 nm, greater than or equal to about 474 nm, greater than or equal to about 475 nm, greater than or equal to about 476 nm, greater than or equal to about 477 nm, greater than or equal to about 478 nm, greater than or equal to about 479 nm, greater than or equal to about 480 nm, greater than or equal to about 485 nm, greater than or equal to about 490 nm, greater than or equal to about 495 nm, greater than or equal to about 500 nm, greater than or equal to about 505 nm, greater than or equal to about 510 nm, greater than or equal to about 515 nm, or greater than or equal to about 520 nm.

The core shell quantum dot may have a maximum PL peak wavelength of less than or equal to about 600 nm, less than or equal to about 590 nm, less than or equal to about 580 nm, less than or equal to about 570 nm, less than or equal to about 560 nm, less than or equal to about less than or equal to about 550 nm, for example, less than or equal to about 540 nm, or less than or equal to about 535 nm. The quantum dot of an embodiment may emit green light. The green light may have a maximum luminescent peak wavelength of from about 500 nm to about 560 nm (e.g., greater than or equal to about 515 nm and less than or equal to about 535 nm).

The core shell quantum dot may have a maximum PL peak wavelength in a wavelength range of greater than or equal to about 460 nm to less than or equal to about 580 nm, greater than or equal to about 465 nm to less than or equal to about 550 nm, greater than or equal to about 470 nm to less than or equal to about 540 nm, or greater than or equal to about 480 nm to less than or equal to about 540 nm.

The (cadmium free) core shell quantum dot of an embodiment may have a FWHM of less than about 50 nm, less than or equal to about 45 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, less than or equal to about 28 nm, less than or equal to about 27 nm, less than or equal to about 26 nm, or less than or equal to about 25 nm.

The (cadmium free) core shell quantum dot of an embodiment may have a FWHM of greater than about 5 nm, greater than or equal to about 10 nm, greater than or equal to about 15 nm, greater than or equal to about 18 nm, or greater than or equal to about 20 nm.

The core shell quantum dot may include an organic ligand e.g., on a surface thereof, for example bound thereto. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, $R_2POOH$, a polymeric organic ligand, or a combination thereof wherein R and R' are the same or different, and are independently a C1 to C40 (e.g., C3 to C30 or C6 to C24) substituted or unsubstituted aliphatic hydrocarbon group (alkyl, alkenyl, or alkynyl) group or a C6 to C40 substituted or unsubstituted aromatic hydrocarbon group, or a combination thereof. Two or more different organic ligands may be used.

The organic ligand may coordinate to, e.g., be bound to, the surface of the quantum dot, helping the nanocrystal to be well dispersed in a solution. Examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methyl amine, ethyl amine, propyl amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methylphosphine (e.g., trimethylphosphine, methyldiphenylphosphine, etc.), a substituted or unsubstituted ethylphosphine (e.g., triethylphosphine, ethyldiphenylphosphine, etc.), a substituted or unsubstituted propylphosphine, a substituted or unsubstituted butylphosphine, a substituted or unsubstituted pentylphosphine, or a substituted or unsubstituted octylphosphine (e.g., trioctylphosphine (TOP)); a phosphine oxide such as a substituted or unsubstituted methylphosphine oxide (e.g., trimethylphosphine oxide, methyldiphenylphosphine oxide, etc.), a substituted or unsubstituted ethylphosphine oxide (e.g., triethylphosphine oxide, ethyldiphenylphosphine oxide, etc.), a substituted or unsubstituted propylphosphine oxide, a substituted or unsubstituted butylphosphine oxide, or a substituted or unsubstituted octylphosphine oxide (e.g., trioctylphosphine oxide (TOPO)); diphenylphosphine, diphenylphosphine oxide, triphenylphosphine, or triphenylphosphine oxide; a mono- or di(C5 to C20 alkyl)phosphinic acid such as a mono- or dihexylphosphinic acid, a mono- or dioctylphosphinic acid, a mono- or di(dodecyl)phosphinic acid, a mono- or di(tetradecyl)phosphinic acid, a mono- or di(hexadecyl) phosphinic acid, a mono- or di(octadecyl)phosphinic acid, or a combination thereof; a C5 to C20 alkylphosphinic acid, a C5 to C20 alkylphosphonic acid such as hexylphosphonic acid, octylphosphonic acid, dodecylphosphonic acid, tetradecylphosphonic acid, hexadecylphosphonic acid, octadecylphosphonic acid, or a combination thereof; and the like, but are not limited thereto. Two or more different organic ligand compounds may be used.

In an embodiment, the organic ligand compound may be a combination of RCOOH and an amine (e.g., $RNH_2$, $R_2NH$, $R_3N$, or a combination thereof). The organic ligand may not include an organic compound having a thiol moiety and an amino group, a carboxylic acid group, or a combination thereof.

The organic ligand may not include a multifunctional compound having a thiol moiety and at least one of an amino group and a carboxylic acid group (i.e., an amino group, a carboxylic acid, or a combination thereof). The organic ligand may not include glutathione compound. The quantum dot may be water-insoluble.

When dispersed in water, the core shell quantum dot may show an average particle size of greater than or equal to about 300 nm, greater than or equal to about 400 nm, greater than or equal to about 500 nm, or greater than or equal to about 900 nm as determined by a dynamic light scattering (DLS) analysis. When dispersed in an organic solvent (such as toluene, octane, or the like), the core shell quantum dot may be configured to form an organic solution having an average particle size of less than or equal to about 500 nm, less than or equal to about 400 nm, less than or equal to about 300 nm, less than or equal to about 200 nm, less than or equal to about 100 nm, or less than or equal to about 90 nm as determined by a DLS analysis. Examples of the organic solvent will be described below.

In an embodiment, a method of manufacturing the core shell quantum dot(s) includes:

preparing a core particle including a first semiconductor nanocrystal core including zinc, tellurium, and selenium by reacting a zinc precursor, a selenium precursor, and a tellurium precursor at a core formation temperature to form the first nanocrystal, and adding a treating agent to a reaction medium including the nanocrystal for a post treatment, and reacting a zinc precursor with a chalcogen element precursor (for example, including a selenium precursor, a sulfur precursor, or a combination thereof), in the presence of the core particle and a shell formation organic ligand, at a shell formation temperature to form a semiconductor nanocrystal shell including the zinc chalcogenide on the core particle, or at least a portion of a surface of the core particle.

In an embodiment, the treating agent may include a sulfur compound such as an organic thiol compound, sulfur dispersed in an alkyl phosphine solvent (S/TOP), a bis(trialkylsilyl) sulfide compound, or a combination thereof; a metal compound (e.g., including a zinc); or a combination thereof.

The metal compound may include a metal halide, an organic metal compound, or a combination thereof. The metal compound for the treating agent may include zinc. The organic metal compound (or complex) may include for example, an organic carboxylate-metal compound, an organic amine-metal compound, a product obtained by a reaction between a metal carboxylate such as a metal oleate and a sulfur compound for example, a thiol compound such as dodecane thiol, S/TOP, TMSi$_2$S, or a combination thereof. The organic metal compound may include a bond between the metal and sulfur.

The organic thiol compound may have a C1 to C30 hydrocarbon group (e.g., linear or branched alkyl, alkenyl, or alkynyl). The organic thiol compound may include a compound represented by RSH (wherein R is for example unsubstituted C1 to C30 aliphatic hydrocarbon group e.g., alkyl, alkenyl, or alkynyl)

The metal halide may include a zinc chloride. The organic carboxylate metal compound may be prepared by reacting a metal precursor such as a metal acetate, a metal acetylacetonate, or a metal chloride with an carboxylic acid compound (e.g., a fatty acid such as oleic acid) in an organic solvent such as octadecene or trioctylamine at an elevated temperature such as about 50° C. or greater, or 60° C. or greater and less than or equal to about 200° C.

The organic amine metal compound may be prepared by reacting a metal precursor such as a metal acetate, a metal acetylacetonate, or a metal chloride with an organic amine compound (e.g., a fatty amine such as oleic amine) in an organic solvent such as octadecene at an elevated temperature such as about 50° C. or greater, or 60° C. or greater and less than or equal to about 200° C.

The organic metal compound having a bond between the metal and the sulfur may be prepared by mixing and reacting a metal carboxylate with a sulfur compound (such as dodecane thiol, S/TOP, TMSi$_2$S, or a combination thereof) at a temperature of less than or equal to about 50° C., less than or equal to about 30° C., or a low temperature below 0° C. for example in an organic solvent such as an alkane or alkene solvent (e.g., octadecene) or alkylphospine solvent such as TOP.

The treating agent may be added in a dissolved state in an appropriate organic solvent, for example, a (C1 to C20 or C5 to C12 alkyl)phosphine such as trioctylphosphine, or a ketone solvent such as acetone.

The preparation of the core particle may include:
preparing a zinc precursor organic solution including a zinc precursor and a first organic ligand in a first organic solvent, and while heating the zinc precursor organic solution at a first reaction temperature, adding a selenium precursor, a tellurium precursor, a hydride compound, and at least one, second organic ligand.

The first reaction temperature (e.g., for core formation) may be greater than or equal to about 250° C., greater than or equal to about 260° C., greater than or equal to about 270° C., greater than or equal to about 280° C., greater than or equal to about 290° C., or greater than or equal to about 300° C. The first reaction temperature may be less than or equal to about 350° C., for example, less than or equal to about 340° C., less than or equal to about 330° C., less than or equal to about 320° C., or less than or equal to about 310° C. The reaction time for the core formation is not particularly limited and may be selected appropriately.

The reaction temperature for the shell formation may be selected appropriately in any suitable range of greater than or equal to about 200° C., for example, greater than or equal to about 210° C., greater than or equal to about 220° C., greater than or equal to about 230° C., greater than or equal to about 240° C., greater than or equal to about 250° C., greater than or equal to about 260° C., greater than or equal to about 270° C., greater than or equal to about 280° C., or greater than or equal to about 290° C. and less than or equal to about 340° C., for example, less than or equal to about 325° C. or less than or equal to about 310° C. The reaction time for the shell formation may be selected appropriately in light of a desired shell composition.

The post treatment may be carried out at a temperature of greater than or equal to about 50° C., greater than or equal to about 60° C., greater than or equal to about 80° C., greater than or equal to about 100° C., greater than or equal to about 150° C., greater than or equal to about 200° C., or greater than or equal to about 240° C. and less than or equal to the core formation temperature. The post treatment may be carried out at a temperature of less than or equal to about 300° C., less than or equal to about 290° C., less than or equal to about 280° C., less than or equal to about 270° C., less than or equal to about 250° C., less than or equal to about 200° C., less than or equal to about 180° C., or less than or equal to about 150° C.

Details for the composition of the core shell quantum dot(s) and the core and the semiconductor nanocrystal shell are the same as set forth above. The synthesized core(s) may be separated from the reaction system (e.g., prior to the shell synthesis) (for example by adding a non-solvent). Details for the non-solvent will be set forth below in detail.

In an embodiment, the tellurium precursor used during the core synthesis may include tellurium dispersed in a second organic solvent and a concentration of the tellurium in the tellurium precursor (solution) may be greater than about 0.1 moles per liter (M), for example, greater than or equal to about 0.5 M, greater than or equal to about 1 M, greater than or equal to about 1.5 M, greater than or equal to about 2 M, or greater than or equal to about 2.5 M. The concentration of the tellurium may be less than or equal to about 10 M, less than or equal to about 5 M, or less than or equal to about 4 M. By adopting a tellurium concentration within the above ranges, reactivity of the tellurium may increase and a core with improved qualities may be prepared.

In an embodiment of the synthesis of the core, prior to being added to the zinc precursor organic solution, the selenium precursor, the tellurium precursor, the metal hydride compound, and the second organic ligand may be mixed together at a temperature of less than about 80° C., for example, less than or equal to about 75° C., less than or equal to about 70° C., less than or equal to about 65° C., less than or equal to about 60° C., less than or equal to about 55° C., less than or equal to about 50° C., or less than or equal to about 45° C. to form a single stock solution.

The amount of the treating agent used in the reaction may be selected appropriately taking into consideration the types of the precursors and the treating agent. In an embodiment, the treating agent may be used in an amount per 1 mole of the zinc precursor, of greater than or equal to about 0.1 moles, greater than or equal to about 0.3 moles, greater than or equal to about 0.5 moles, greater than or equal to about 0.7 moles, greater than or equal to about 0.9 moles, greater than or equal to about 1 mole, or greater than or equal to about 1.2 moles and less than or equal to about 5 moles, less than or equal to about 4 moles, less than or equal to about 3 moles, less than or equal to about 2 moles, less than or equal to about 1 mole, less than or equal to about 0.9 moles, less than or equal to about 0.7 moles, or less than or equal to about 0.5 moles.

The metal hydride compound may include lithium, aluminum, or a combination thereof. The metal hydride compound may include an aluminum hydride compound, a lithium hydride compound, or a combination thereof. The metal hydride compound may include an organic metal hydride compound (for example, having a, e.g., at least one, hydrocarbon group), an inorganic metal hydride compound, or a combination thereof. The metal hydride compound may include an alkyl lithium hydride (e.g., dialkyl lithium borohydride where each alkyl group may have from 1 to 6 carbon atoms), a lithium aluminum hydride compound, or a combination thereof.

An amount of the metal hydride is not particularly limited and may be selected appropriately. An amount of the metal hydride may be, per one mole of tellurium, greater than or equal to about 0.01 moles, greater than or equal to about 0.05 moles, greater than or equal to about 0.1 moles, greater than or equal to about 0.5 moles, or greater than or equal to about 1 mole. An amount of the metal hydride may be, per one mole of tellurium, less than or equal to about 10 moles, less than or equal to about 5 moles, or less than or equal to about 3 moles.

In the preparation of the core, a mole ratio of the tellurium to the selenium introduced into the reaction system (Te:Se) may be greater than about 0.25:1, greater than or equal to about 0.3:1, greater than or equal to about 0.4:1, greater than or equal to about 0.5:1, greater than or equal to about 0.7:1, greater than or equal to about 0.9:1, greater than or equal to about 1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, or greater than or equal to about 2.5:1.

In the preparation of the core, a mole ratio of the tellurium to the selenium introduced into the reaction system (Te:Se) may be less than or equal to about 10:1, less than or equal to about 9:1, less than or equal to about 8:1, less than or equal to about 7:1, less than or equal to about 6:1, less than or equal to about 5:1, less than or equal to about 4:1, less than or equal to about 3:1, less than or equal to about 2:1, or less than or equal to about 1.5:1.

In the preparation of the core, a mole ratio of the zinc to the tellurium may be selected appropriately taking into consideration a desired composition, the precursor(s), or the like. According to an embodiment, in the preparation of the core, an amount of the zinc with respect to one mole of the tellurium may be greater than or equal to about 1 moles, greater than or equal to about 2 moles, greater than or equal to about 3 moles, greater than or equal to about 4 moles, or greater than or equal to about 5 moles. According to an embodiment, in the preparation of the core, an amount of the zinc to one mole of the tellurium may be, less than or equal to about 20 moles, less than or equal to about 15 moles, less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, or less than or equal to about 2 moles.

In an embodiment, formation of the shell may be carried out by heating (or vacuum treating) a metal shell precursor (i.e., a metal precursor for the shell) and an organic ligand in an organic solvent at a predetermined temperature (e.g., at a temperature of greater than or equal to about 100° C., for example, greater than or equal to about 120° C.) under vacuum, changing an atmosphere of a reaction system to an inert gas and heating the same at a predetermined reaction temperature.

The core and a non-metal shell precursor (e.g., sulfur and/or selenium precursor(s)) may be added into the (heated) reaction system to carry out a reaction. The non-metal shell precursor(s) may be injected at the same time or sequentially during the reaction taking into consideration a desired shell composition. The metal shell precursor may include a zinc precursor, a gallium precursor, or a combination thereof.

The shell having a desired composition (e.g., a gradient composition or a multi-layered composition) may be formed.

In an embodiment, the formation of the semiconductor nanocrystal shell may include reacting the zinc precursor and at least one of the selenium precursor or the sulfur precursor (or both). In an embodiment, the formation of the semiconductor nanocrystal shell may include reacting the gallium precursor and the sulfur precursor. In an embodiment, the semiconductor nanocrystal shell formation may include reacting the zinc precursor and the selenium precursor and then reacting the zinc precursor and the sulfur precursor. For example, in an embodiment, a zinc precursor may react with a selenium precursor to form a first shell layer including zinc and selenium and then reacted with a sulfur precursor to form a second shell layer including zinc and sulfur. In an embodiment, a zinc precursor may react with the selenium and the sulfur precursors to form a semiconductor nanocrystal shell including zinc, selenium, and sulfur (e.g., ZnSeS).

In the above method, the zinc precursor may include a Zn powder, ZnO, an alkylated Zn compound (e.g., C2 to C30 alkyl (e.g., dialkyl) zinc such as dimethyl zinc, diethyl zinc), a Zn alkoxide (e.g., a zinc ethoxide), a Zn carboxylate (e.g., a zinc acetate or zinc aliphatic carboxylate, for example, zinc long chain aliphatic carboxylate such as zinc oleate), a Zn nitrate, a Zn perchlorate, a Zn sulfate, a Zn acetylacetonate, a Zn halide (e.g., a zinc chloride), a Zn cyanide, a Zn hydroxide, zinc carbonate, zinc peroxide, or a combination thereof. Examples of the zinc precursor may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof.

The gallium precursor may include a mono, di, or tri (C1 to C20 or C5 to C12 alkyl)phosphine-gallium prepared by dispersing an alkylated gallium in an alkylphosphine solvent (e.g., TOP-gallium), gallium carboxylate, gallium-organic compound complex. The gallium organic compound complex may include a compound obtained by reacting a gallium carboxylate with a fatty amine, a fatty carboxylate, a mono, di, or tri (C1 to C20 or C5 to C12 alkyl)phosphine, or a combination thereof at an elevated temperature of greater than or equal to about 50° C., and less than or equal to about 200° C.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The tellurium precursor may include tellurium-trioctylphosphine (Te-TOP), tellurium-tributylphosphine (Te-TBP), tellurium-triphenylphosphine (Te-TPP), tellurium-diphenylphosphine (Te-DPP), or a combination thereof, but is not limited thereto.

The sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), sulfur-octadecene (S-ODE), bistrimethylsilyl sulfide, ammonium sulfide, sodium sulfide, or a combination thereof.

The first, second, and/or third organic solvent may be same as or different from each other. The first, second, and/or third organic solvent (hereinafter, simply referred to as an organic solvent) may be a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctylphosphine) substituted with a, e.g., at least one (e.g., 1, 2, or 3), C6 to C22 alkyl group, a phosphine oxide (e.g., trioctylphosphine oxide) substituted with a, e.g., at least one (e.g., 1, 2, or 3), C6 to C22 alkyl group, a C12 to C22 aromatic ether such as a phenyl ether or a benzyl ether, or a combination thereof.

The first organic ligand and the second organic ligand may be the same.

The first organic ligand and the second organic ligand may be different. Details for the first and the second organic ligands and the shell formation organic ligand are the same as set forth above about the organic ligand.

In an embodiment, the first organic ligand may include a fatty acid (e.g., including at least C5, at least C10, or at least C15 hydrocarbon group) and the second organic ligand may include an organic amine (e.g., a primary amine including one at least C5, at least C10, or at least C15 aliphatic or aromatic hydrocarbon group), an aromatic phosphine compound, or a combination thereof. The primary amine may include $RNH_2$, wherein R is an aliphatic hydrocarbon group such as alkyl, alkenyl, or alkynyl, a C6 to C40 aryl, or a combination thereof.

The carbon number of the aliphatic hydrocarbon group may be greater than or equal to about 5, greater than or equal to about 10, greater than or equal to about 15, greater than or equal to about 16, greater than or equal to about 17, greater than or equal to about 18, greater than or equal to about 19, or greater than or equal to about 20; and/or less than or equal to about 50, less than or equal to about 40, or less than or equal to about 30.

Amounts of the first organic ligand and the second organic ligand may be selected taking into consideration types of the organic ligands and types of the precursors.

An amount of the first organic ligand (or an amount of the second ligand or an amount of the shell formation organic ligand) may be, with respect to 1 mole of the zinc precursor, greater than or equal to about 0.1 moles, greater than or equal to about 0.2 moles, greater than or equal to about 0.3 moles, greater than or equal to about 0.4 moles, greater than or equal to about 0.5 moles, greater than or equal to about 0.6 moles, greater than or equal to about 0.7 moles, greater than or equal to about 0.8 moles, greater than or equal to about 0.9 moles, greater than or equal to about 1 moles, greater than or equal to about 2 moles, greater than or equal to about 3 moles, greater than or equal to about 4 moles, or greater than or equal to about 5 moles. An amount of the first organic ligand (or an amount of the second ligand or an amount of the shell formation organic ligand) may be, with respect to 1 mole of the zinc precursor, less than or equal to about 20 moles, less than or equal to about 19 moles, less than or equal to about 18 moles, less than or equal to about 17 moles, less than or equal to about 16 moles, less than or equal to about 15 moles, less than or equal to about 14 moles, less than or equal to about 13 moles, less than or equal to about 12 moles, less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, less than or equal to about 2 moles, or less than or equal to about 1 mole.

A mole ratio between the first organic ligand and the second organic ligand (the first organic ligand: the second organic ligand) may be 1:0.1 or greater, 1:0.5 or greater, 1:0.9 or greater, or 1:1 or greater, and/or 1:10 or less; 1:5 or less, 1:2.5 or less, or 1:1.5 or less; or a combination thereof.

In an embodiment, the selenium precursor, the tellurium precursor, the metal hydride compound may be injected into the zinc precursor organic solution in a mixed state optionally together with the organic ligand. In an embodiment, the selenium precursor, the tellurium precursor, and the metal hydride compound may be injected into the zinc precursor organic solution sequentially.

In a reaction system for the core formation and a reaction system for the shell formation, an amount of each precursor and a concentration thereof may be selected taking into consideration a desired composition of the core and the shell, a reactivity between the core and shell precursors, or the like. In an embodiment, taking into consideration a desired composition of a final quantum dot (e.g., a ratio between elements such as Zn, S, Se, Te, or a combination thereof), ratios between the precursors may be controlled. The composition of the final quantum dot may be determined by an appropriate analysis tool such as an inductively coupled plasma atomic emission spectroscopy.

After the formation of the core, or the core shell quantum dot, a non-solvent is added to the nanocrystal particles coordinated with, e.g., bound to, a ligand compound to facilitate separation or isolation of the core particles or the core shell quantum dots. The non-solvent may be a polar solvent that is miscible with the solvent used in the core formation reaction, or the core shell quantum dot formation reaction, and is not capable of dispersing the produced nanocrystals. The non-solvent may be selected taking into consideration the solvent used in the reaction, and may be for example acetone, ethanol, butanol, isopropanol, ethanediol, water, tetrahydrofuran (THF), dimethylsulfoxide (DMSO), diethyl ether, formaldehyde, acetaldehyde, a solvent having a similar solubility parameter to the foregoing non-solvents, or a combination thereof. Separation of the nanocrystal particles may involve centrifugation, sedimentation, chromatography, or filtration. The separated nanocrystal particles may be added to a washing (or dispersing) solvent and washed (or dispersed), if desired.

Types of the washing (dispersing) solvent are not particularly limited and a solvent having similar solubility parameter to that of the ligand may be used and examples thereof may include hexane, heptane, octane, chloroform, toluene, benzene, or the like.

In an embodiment, the organic ligand may not include a multi-functional organic compound having a thiol moiety and at least one of an amino group and a carboxylic acid group. For example, the organic ligand may not include glutathione compound.

The quantum dot may be water-insoluble.

When dispersed in water, the quantum dot may have an average particle size of greater than or equal to about 300 nm as determined by a dynamic light scattering (DLS) analysis. When being dispersed in an organic solvent (such as toluene, octane, or the like), the quantum dot may be configured to form an organic solution having an average particle size of less than 50 nm, e.g., less than or equal to about 30 nm, or less than or equal to about 20 nm as determined by a DLS analysis.

In an embodiment, a quantum dot composition includes the aforementioned (e.g., a plurality of) core shell quantum dot(s) (hereinafter, may be referred to simply as a quantum dot or quantum dots); and optionally a (photo)polymerizable monomer having a, e.g., at least one, carbon-carbon double bond. The composition may further include an organic solvent, a liquid vehicle, a dispersing agent (e.g., a binder monomer or polymer), a (photo) initiator; or a combination thereof. The binder may disperse the quantum dots in the composition. The binder monomer or polymer may include a carboxylic acid group containing compound. The composition may be a photosensitive composition.

Details of the quantum dots in the composition are the same as set forth above. An amount of the quantum dot(s) in the composition (or a composite that will be described below) may be appropriately adjusted taking into consideration a desirable final use (e.g., a photoluminescent color filter, etc.) and the composition (or the composite). In an embodiment, the amount of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a total weight or a total solid content of the composition. The amount of the quantum dot may be less than or equal to about 70 wt %, for example, less than or equal to about 65 wt %, less than or equal to about 60 wt %, less than or equal to about 55 wt %, or less than or equal to about 50 wt %, based on a total weight or a total solid content of the composition. An amount of a given component based on a total solid content of the composition may correspond to an amount of the given component in a composite prepared from the composition.

In a composition according to an embodiment, a dispersing agent may contribute to obtain an appropriate dispersibility of the quantum dots. The dispersing agent may include an organic compound (a monomer or a polymer) including a carboxylic acid group. The binder polymer may be an insulating polymer.

The organic compound including a carboxylic acid group may include a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer having a backbone structure in which two aromatic rings are bound to a quaternary carbon atom that is a constituent atom of another cyclic moiety in the main chain and including a carboxylic acid group (—COOH) (hereinafter, a cardo binder); or a combination thereof.

The dispersing agent may include a first monomer, a second monomer, and optionally a third monomer.

In the composition, an amount of the dispersing agent or the binder (polymer or monomer) may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight or a total solid content of the composition, but is not limited thereto. The amount of the binder polymer may be less than or equal to about 55 wt %, less than or equal to about 45 wt %, less than or equal to about 35 wt %, for example less than or equal to about 33 wt %, or less than or equal to about 30 wt %, based on a total weight or a total solid content of the composition.

The composition may include a polymerizable (e.g., photopolymerizable) monomer including the carbon-carbon double bond. The monomer may include a (e.g., photopolymerizable) acryl-based monomer, i.e., a monomer containing an acryl group. The polymerizable monomer may be a precursor for an insulating polymer.

An amount of the polymerizable monomer may be greater than or equal to about 0.5 wt %, for example, greater than or equal to about 1 wt % or greater than or equal to about 2 wt %, based on a total weight or a total solid content of the composition. The amount of the photopolymerizable monomer may be less than or equal to about 30 wt %, for example, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %, based on a total weight or a total solid content of the composition.

The composition may include a (photo or thermal)-initiator that can be used for (photo)polymerization of the monomers. The (photo or thermal)-initiator is a compound accelerating a radical reaction (e.g., radical polymerization of monomer) by producing radical chemical species under a mild condition (e.g., by heat or light). As indicated, the initiator may be a thermal initiator or a photoinitiator. Compounds for the initiator are not particularly limited and may be selected appropriately.

In the composition, an amount of the initiator may be appropriately adjusted taking into consideration a type of the polymerizable monomer and/or an amount of the polymerizable monomer. In an embodiment, the initiator may be used in an amount range of about at least 0.01 wt %, at least about 1 wt % and less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight or a total solid content of the composition, but is not limited thereto.

The composition or a composite prepared therefrom may further include a (multi- or mono-functional) thiol compound including at least one (e.g., at least two, three, or four) thiol group(s) (for example, at a terminal end of the (multi- or mono-functional) thiol compound), a metal oxide fine particle, or a combination thereof.

The metal oxide fine particle may include $TiO_2$, $SiO_2$, $BaTiO_3$, $Ba_2TiO_4$, $ZnO$, or a combination thereof. As used herein, the wording "metal oxide" may include an oxide of a metal or a metalloid. The metal oxide fine particle may be non-light emissive.

A diameter of the metal oxide fine particle is not particularly limited and may be selected appropriately. The diameter of the metal oxide fine particle may be greater than or equal to about 100 nm, for example, greater than or equal to about 150 nm, or greater than or equal to about 200 nm and less than or equal to about 1,000 nm or less than or equal to about 800 nm.

The multi-functional thiol compound may be a dithiol compound, a trithiol compound, tetrathiol compound, or a combination thereof. For example, the thiol compound may be glycol (e.g., ethylene glycol) di-3-mercaptopropionate, glycol (e.g., ethylene glycol) dimercapto acetate, trimethylolpropane tris(3-mercaptopropionate), pentaerythritol tetrakis (3-mercaptopropionate), pentaerythritol tetrakis (2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

An amount of the (mono- and/or multi) thiol compound may be less than or equal to about 50 wt %, less than or equal to about 45 wt %, less than or equal to about 40 wt %, less than or equal to about 35 wt %, less than or equal to about 30 wt %, less than or equal to about 25 wt %, less than or equal to about 20 wt %, less than or equal to about 15 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight (or total solid content) of the composition. The amount of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, greater than or equal to about 15 wt %, greater than or equal to about 20 wt %, or greater than or equal to about 25 wt %, based on a total weight (or total solid content) of the composition or the composite.

In the composition, an amount of the metal oxide fine particle may be greater than or equal to about 1 wt %, greater than or equal to about 5 wt %, or greater than or equal to about 10 wt % and less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, or less than or equal to about 5 wt %, based on a total weight (or total solid content) of the composition or the composite.

The composition may further include an organic solvent (or a liquid vehicle, hereinafter referred to as an organic solvent). Non limiting examples of the organic solvent may include ethyl 3-ethoxy propionate; ethylene glycols such as ethylene glycol, diethylene glycol, or polyethylene glycol; glycol ethers such as ethylene glycol monomethylether, ethylene glycol monoethylether, diethylene glycol monomethylether, ethylene glycol diethylether, or diethylene glycol dimethylether; glycol ether acetates such as ethylene glycol monomethyl ether acetate, ethylene glycol monoethylether acetate, diethylene glycol monoethylether acetate, or diethylene glycol monobutylether acetate; propylene glycol; propylene glycol ethers such as propylene glycol monomethylether, propylene glycol monoethylether, propylene glycol monopropylether, propylene glycol monobutylether, propylene glycol dimethyl ether, dipropylene glycol dimethyl ether, propylene glycol diethyl ether, or dipropylene glycol diethyl ether; propylene glycol ether acetates such as propylene glycol monomethylether acetate, or dipropylene glycol monoethylether acetate; amides such as N-methylpyrrolidone, dimethyl formamide, or dimethyl acetamide; ketones such as methylethylketone (MEK), methylisobutylketone (MIBK), or cyclohexanone; petroleum such as toluene, xylene, or solvent naphtha; esters such as ethyl acetate, butyl acetate, or ethyl lactate; ethers such as diethyl ether, dipropyl ether, or dibutyl ether; chloroform, a C1 to C40 aliphatic hydrocarbon (e.g., alkane, alkene, or alkyne), a halogen (e.g., chloro) substituted C1 to C40 aliphatic hydrocarbon (e.g., dichloroethane, trichloromethane, or the like), a C6 to C40 aromatic hydrocarbon (e.g., toluene, xylene, or the like), a halogen (e.g., chloro) substituted C6 to C40 aromatic hydrocarbon, or a combination thereof.

A type and an amount of the organic solvent may be appropriately selected by taking into consideration the above main components (i.e., the quantum dot, the dispersing agent, the polymerizable monomer, the initiator, and if used, the thiol compound,) and an additive and an amount of the additive which is described below. The composition may include an organic solvent in a residual amount except for a desired content of the (non-volatile) solid.

The composition (e.g., an ink jet composition) may have a viscosity at 25° C. of greater than or equal to about 4 centiPoise (cPs), greater than or equal to about 5 cPs, greater than or equal to about 5.5 cPs, greater than or equal to about 6.0 cPs, or greater than or equal to about 7.0 cPs. The composition (e.g., an ink jet composition) may have a viscosity at 25° C. of less than or equal to about 12 cPs, less than or equal to about 10 cPs, or less than or equal to about 9 cPs.

If the composition is applied in an inkjet process, the composition may be discharged onto a substrate at room temperature and may form a quantum dot polymer composite or a pattern of quantum dot polymer composite, for example, by heating. Together with the above viscosity, the ink composition may have a surface tension at 23° C. of greater than or equal to about 21 milliNewtons per meter (mN/m), greater than or equal to about 22 mN/m, greater than or equal to about 23 mN/m, greater than or equal to about 24 mN/m, greater than or equal to about 25 mN/m, greater than or equal to about 26 mN/m, greater than or equal to about 27 mN/m, greater than or equal to about 28 mN/m, greater than or equal to about 29 mN/m, greater than or equal to about 30 mN/m, or greater than or equal to about 31 mN/m and less than or equal to about 40 mN/m, less than or equal to about 39 mN/m, less than or equal to about 38 mN/m, less than or equal to about 36 mN/m, less than or equal to about 35 mN/m, less than or equal to about 34 mN/m, less than or equal to about 33 mN/m, or less than or equal to about 32 mN/m. A surface of the ink composition may be less than or equal to about 31 mN/m, less than or equal to about 30 mN/m, less than or equal to about 29 mN/m, or less than or equal to about 28 mN/m.

The composition may further include various additives for a photoresist composition or an ink jet composition. The additive(s) may include a light diffusing agent, a leveling agent, a coupling agent, or the like, for which details described in, for example, US-2017-0052444-A1 may be referred.

In an embodiment, the composition according to an embodiment may be prepared by a method including preparing a quantum dot dispersion including the quantum dots, a dispersing agent, and a solvent; and mixing the quantum dot dispersion with an initiator; a polymerizable monomer (e.g., acryl-based monomer); optionally, the thiol compound; optionally, the metal oxide particulates, and optionally, the aforementioned additive. Each of the components may be mixed sequentially or simultaneously, but mixing orders are not particularly limited.

The composition of an embodiment may be used for providing a pattern including a quantum dot composite (e.g., a quantum dot-polymer composite). The composition may provide a quantum dot polymer composite via (e.g. radical) polymerization. In an embodiment, the composition may be a photoresist composition that may be applicable to a photolithography process. In an embodiment, the composition may be an ink composition that may be applicable to an ink jet process (e.g., a liquid drop discharging method such as an ink jet printing).

In an embodiment, a quantum dot composite (e.g., quantum dot-polymer composite) may include a (polymer) matrix; and the core shell quantum dots dispersed in the matrix. The quantum dot composite may further include a metal oxide fine particle(s) dispersed in the matrix. The (polymer) matrix may include a crosslinked polymer, a linear polymer, or a combination thereof. The cross-linked polymer may include a thiolene polymer, a cross-linked poly(meth)acrylate, a crosslinked polyurethane, a cross-linked epoxy resin, a crosslinked vinyl polymer, a cross-linked silicone resin, or a combination thereof. In an embodiment, the cross-linked polymer may be a polymerization product of the polymerizable monomer and, optionally, the multi-thiol compound. The linear polymer may include a repeating unit derived from carbon-carbon unsaturated bonds (e.g., a carbon-carbon double bond). The repeating unit may include a carboxylic acid group. The linear polymer may include an ethylene repeating unit.

The matrix may include the dispersing agent (e.g., a binder monomer or polymer), a polymerization product (e.g., insulating polymer) of a polymerizable monomer including a carbon-carbon double bond (at least one, for example, at least two, at least three, at least four, or at least five), optionally a polymerization product of the polymerizable monomer and a multi thiol compound including at least two thiol groups (e.g., at a terminal end of the multi thiol compound), or a combination thereof. The quantum dot polymer composite may further include a metal oxide fine particle(s). Two or more of the foregoing components (e.g., dispersing agent, polymerization product, metal oxide fine particles) can be present.

The (polymer) matrix may include a crosslinked polymer, a linear polymer, or a combination thereof. The cross-linked polymer may include a thiolene polymer, a cross-linked poly(meth)acrylate, or a combination thereof. In embodiment, the crosslinked polymer may include a polymerization product of the polymerizable monomer and optionally a multi thiol compound. Details of the quantum dots, the dispersing agent, or the binder polymer, the polymerizable monomer, and the multi thiol compound are the same as described above.

A (patterned) film of the quantum dot-polymer composite may have, for example, a thickness of less than or equal to about 30 micrometers (µm), for example less than or equal to about 25 µm, less than or equal to about 20 µm, less than or equal to about 15 µm, less than or equal to about 10 µm, less than or equal to about 8 µm, less than or equal to about 7 µm and greater than about 2 µm, for example, greater than or equal to about 3 µm, greater than or equal to about 3.5 µm, greater than or equal to about 4 µm, greater than or equal to about 5 µm, or greater than or equal to about 6 µm.

In an embodiment, a patterned film may include at least one repeating section configured to emit light of a predetermined wavelength. In an embodiment, the repeating section may include a first section emitting first light. The repeating section may include a second section emitting second light having a different maximum (photo) luminescent peak wavelength from a maximum (photo) luminescent peak wavelength of the first light. At least one of the first section and the second section may include the quantum dot composite.

The first light or the second light may be red light having a maximum photoluminescence peak wavelength which is present between about 600 nm and about 650 nm (e.g., about 620 nm to about 650 nm) or green light having a maximum photoluminescence peak wavelength which is present between about 500 nm and about 550 nm (e.g., about 510 nm to about 540 nm). The patterned film may further include a third section emitting or passing third light (e.g., blue light) different from the first light and the second light. The third light may have a maximum (photo) luminescent peak wavelength ranging from 380 nm to 480 nm.

As represented in FIG. 1A, a patterned film of a quantum dot composite may be prepared by using a photoresist composition. In such a method, a composition is applied to form a film having a predetermined thickness on a substrate in an appropriate method of spin coating, slit coating, and the like (Step 1). The formed film may be, optionally, pre-baked (PRB) (Step 2). The pre-baking may be performed by selecting an appropriate condition from known conditions of a temperature, time, an atmosphere, and the like. A selected area of the formed (or optionally pre-baked) film is exposed to light having a predetermined wavelength (e.g., of less than or equal to about 400 nm) (Step 3). A wavelength and intensity of the light may be selected considering types and amounts of the photoinitiator, types, and amounts of the core shell quantum dots, and the like.

The exposed film is treated with an alkali developing solution (e.g., dipping or spraying) to dissolve an unexposed region and obtain a desired pattern (Step 4). The obtained pattern may be, optionally, post-baked (POB) to improve crack resistance and solvent resistance of the pattern, for example, at about 150° C. to about 230° C. for a predetermined time (e.g., greater than or equal to about 10 minutes or greater than or equal to about 20 minutes) (Step 5).

In an embodiment where the quantum dot-polymer composite pattern has a plurality of repeating sections, a quantum dot-polymer composite having a desired pattern may be obtained by preparing a plurality of compositions including a core shell quantum dot having desired photoluminescence properties (a photoluminescence peak wavelength and the like) (e.g., a red light emitting quantum dot, a green light emitting quantum dot, or optionally, a blue light emitting quantum dot) to form each repeating section and an appropriate number of times (e.g., twice or more or three times or more) repeating a formation of the above pattern about each composition (Step 6).

Figure 1B:
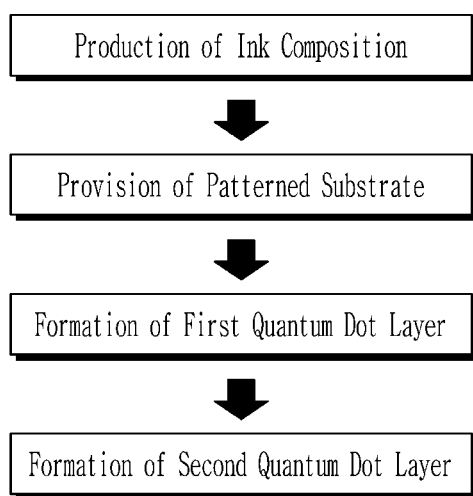
FIG. 1B schematically represents a process of producing a quantum dot composite pattern using an ink composition.

A quantum dot composite pattern may be formed by using an ink composition configured to form a pattern via an ink jet manner. Referring to FIG. 1b, the method includes preparing an ink composition; obtaining a substrate including a pattern of, for example, an electrode and optionally an pixel area formed by a bank; depositing an ink composition on the substrate (or the pixel area) to form a first quantum dot layer (or a first repeating section); and depositing an ink composition on the substrate (or the pixel area) to form a second quantum dot layer (or a second repeating section). Formation of the first quantum dot layer and the second quantum dot layer may be carried out simultaneously or sequentially.

Deposition of the ink composition may be carried out using an appropriate droplet discharging system such as an ink jet printer or a nozzle printing system. The deposited ink composition may be heated to remove a solvent and optionally to carry out a polymerization, and thus, provide a (first or second) quantum dot layer.

The quantum dot composite pattern may be utilized as a photoluminescent color filter in a display device.

In an embodiment, an electronic device may include the core shell quantum dot(s). The electronic device may include a display device, a light emitting diode (LED), an organic light emitting diode (OLED), a QD LED, a sensor, a solar cell, an imaging sensor, or a liquid crystal display (LCD), but is not limited thereto. The core shell quantum dots may be included in an electronic apparatus. The electronic apparatus may include a handheld terminal, a monitor, a notebook computer, a television, an electronic display board, a camera, an automatic vehicle, but is not limited thereto. The electronic apparatus may be a handheld terminal, a monitor, a notebook computer, or a television each of which includes a display device (or a light emitting device) including a quantum dot. The electronic apparatus may be a camera or a handheld terminal each of which includes an image sensor including a quantum dot. The electronic apparatus may be a camera or an automatic vehicle each of which includes a photodetector including the core shell quantum dots.

In an embodiment, a display device (or light emitting device) may include a light emitting element and optionally a light source. The light emitting element may include a light emission layer. The light emitting element may include a substrate and the light emission layer may be disposed on the substrate. The light emission layer may include a film or a patterned film of a quantum dot composite. A light source may be configured to provide the light emitting element with incident light.

The incident light may have a luminescence peak wavelength of greater than or equal to about 440 nm, for example, greater than or equal to about 450 nm and less than or equal to about 560 nm, less than or equal to about 500 nm, less than or equal to about 480 nm, less than or equal to about 470 nm, or less than or equal to about 460 nm.

Figure 2:
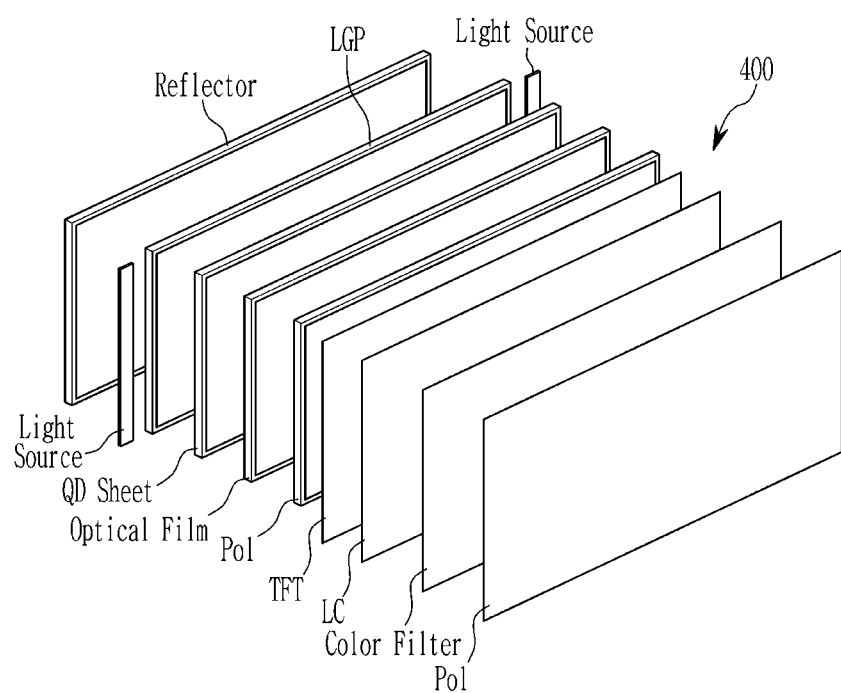
FIG. 2 is an exploded view of a display device according to an embodiment.

In an embodiment, the light emitting element, or the light emission layer, may include a sheet of the quantum dot polymer composite. Referring to FIG. 2, a device 400 of a photoluminescent type may include a backlight unit and a liquid crystal panel (LC) and the backlight unit may include the sheet of the quantum dot polymer composite (QD sheet). The backlight unit may have a structure wherein a reflector, a light guide panel (LGP) and a blue LED light source (Blue-LED), the quantum dot-polymer composite sheet (QD sheet), and various optical films such as a prism, double brightness enhance film (DBEF), and the like are stacked, and a liquid crystal panel is disposed on the backlight unit. Between two polarizers and (pol), a liquid crystal and a color filter may be disposed. The quantum dot polymer composite (QD sheet) may include red quantum dots and green quantum dots that absorbs light from the light source and emits red and green light, respectively. Blue light provided from the light source passes through the quantum dot polymer composite sheet and combined with the red and green lights emitted from the quantum dots is converted into white light. The white light may be separated into a blue light, a green light, and a red light by a color filter in the liquid crystal panel and extracted outside according to the pixel.

In an embodiment, the light emitting layer includes a patterned film of a quantum dot polymer composite, and the patterned film may include a repeating section configured to emit light of a predetermined wavelength. The repeating section may include a first repeating section that may emit a first light. The first section may be a section emitting red light. The repeating section may include a second repeating section that may emit a second light. The second section may be a section emitting green light. The repeating section may include a third repeating section that may emit or transmit a third light. The third section may be a section emitting or transmitting blue light. Further details of the first, second, third section may be referred to above.

The light source includes an element that emits an excitation light. The excitation light may include blue light and optionally green light. The light source may include an LED. The light source may include an organic LED (e.g. OLED). In an embodiment, on a front side (i.e. light emitting face) of the first section and the second section is disposed a first optical element 160 cutting (e,g., absorbing or reflecting) blue light and optionally green light. The light source may include a blue light emitting OLED (organic light emitting diode) and a green light emitting OLED, and in this case, the third section emitting or transmitting blue light is disposed on an optical element that filters or removes green light.

The light source may include a plurality of light emitting units respectively corresponding to the first section and the second section, and each of the light emitting units may include a first electrode and a second electrode facing each other and an electroluminescent layer disposed between the first electrode and the second electrode. The electroluminescent layer may include an organic light emitting material. For example, each light emitting unit of the light source may include an electroluminescent device (e.g., an organic light emitting diode (OLED)) configured to emit light of a predetermined wavelength (e.g., blue light, green light, or a combination thereof). Structures and materials of the electroluminescent device such as the organic light emitting diode (OLED) are not particularly limited.

Figure 3A:
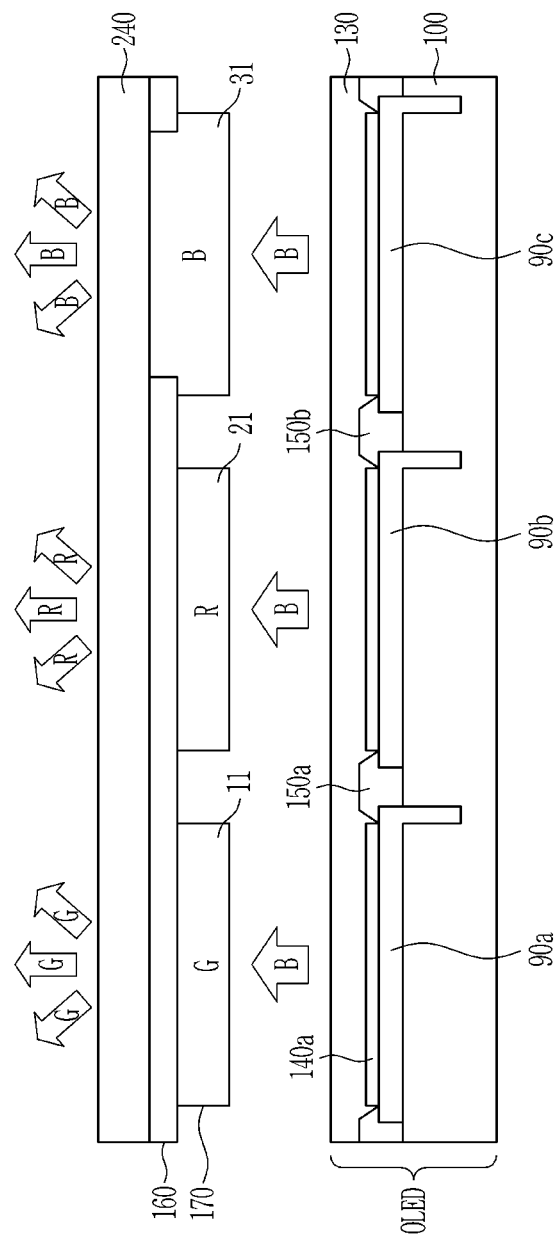
FIG. 3A is a schematic cross-sectional view of a display device according to an embodiment.
Figure 3B:
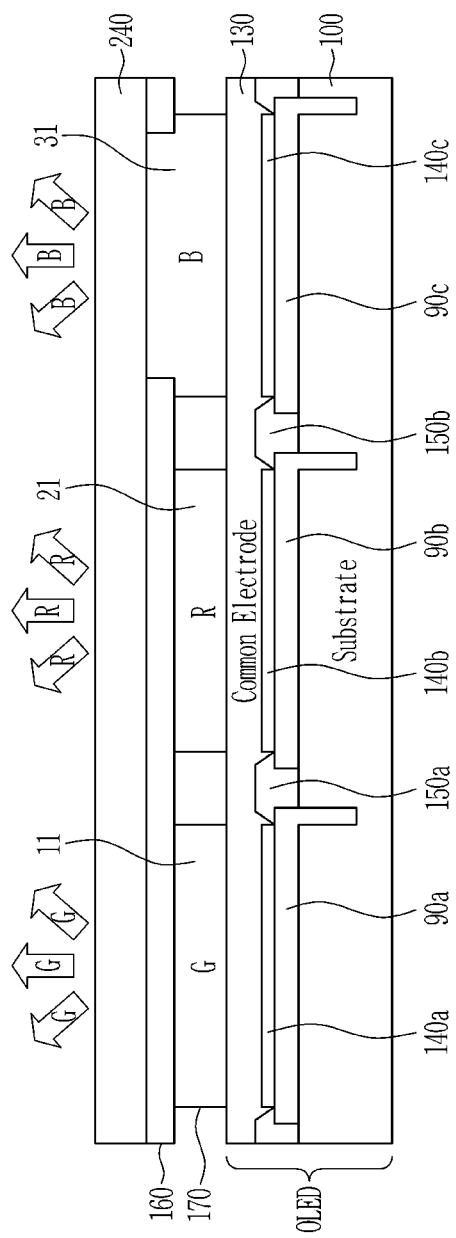
FIG. 3B is a schematic cross-sectional view of a display device according to an embodiment.

FIG. 3A is a schematic cross-sectional view of a display device according to an embodiment, and FIG. 3B is a schematic cross-sectional view of a display device according to another embodiment. Referring to FIGS. 3A and 3B, a light source includes an organic light emitting diode (OLED) emitting blue light. The organic light emitting diode OLED may include (at least two, for example, three or more) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode layer 130 formed on the organic light emitting layer 140a, 140b, 140c.

A thin film transistor and a substrate may be disposed under the organic light emitting diode (OLED). The pixel areas of the OLED may be disposed corresponding to the first, second, and third sections that will be described in detail below, respectively.

A quantum dot composite pattern (e.g., including a first repeating section including green light emitting quantum dots, a second repeating section including red light emitting quantum dots, or a combination thereof) may be disposed for example as a stacked structure further including a substrate, for example, on (e.g., directly on) or over the light source if present.

The light (e.g., blue light, green light, or a combination thereof) emitted from the light source may enter the second section 21 and the first section 11 of the pattern 170 to emit (e.g., converted) red light R and green light G, respectively.

The blue light B emitted from the light source passes through or transmits from the third section 31.

Over the second section 21 emitting red light, the first section 11 emitting green light, or a combination thereof, an optical element 160 may be disposed. The optical element may be an excitation light cut layer or a first optical filter, which cuts (e.g., reflects or absorbs) the excitation light (e.g., blue light, green light, or a combination thereof). The excitation light cut layer or optical element 160 may be disposed on the upper substrate 240, or as shown, the excitation light cut layer 160 may be disposed under the upper substrate 240 (e.g., on a bottom surface of the upper substrate 240). The excitation light cut layer 160 may be disposed between the upper substrate 240 and the quantum dot-polymer composite pattern and over the first section 11 and the second section 21 and if desired, the third section 31. Details of the excitation light cut layer are the same as set forth for the first optical filter below.

The display device may be obtained by separately fabricating the stacked structure and (e.g., blue light emitting) LED or OLED and then assembling the same. Alternatively, the display device may be obtained by forming a quantum dot-polymer composite pattern directly on the LED or OLED.

The substrate may be a substrate including an insulating material. The substrate may include glass; various polymers such as a polyester (e.g., polyethylene terephthalate (PET) polyethylene naphthalate (PEN), a polymethacrylate, or a polyacrylate); a polycarbonate; a polysiloxane (e.g., polydimethylsiloxane (PDMS)); an inorganic material such as $Al_2O_3$ or ZnO; or a combination thereof, but is not limited thereto. A thickness of the substrate may be selected appropriately taking into consideration a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dot.

A wire layer including a thin film transistor or the like is formed on the substrate. The wire layer may further include a gate line, a sustain voltage line, a gate insulating layer, a data line, a source electrode, a drain electrode, a semiconductor, a protective layer, and the like. The detail structure of the wire layer may be verified according to an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described below.

The pixel electrode may function as an anode of the display device. The pixel electrode may be formed of a transparent conductive material such as indium tin oxide (ITO) or indium zinc oxide (IZO). The pixel electrode may be formed of a material having a light-blocking property such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure in which the transparent conductive material and the material having light-blocking properties are stacked sequentially.

Between two adjacent pixel electrodes, a pixel define layer (PDL) may overlap with a terminal end of the pixel electrode to divide the pixel electrode into a pixel unit. The pixel define layer is an insulation layer which may electrically block the at least two pixel electrodes.

The pixel define layer covers a part of the upper surface of the pixel electrode, and the remaining region of the pixel electrode not covered by the pixel define layer may provide an opening. An organic emission layer that will be described below may be formed on the region defined by the opening.

The organic emission layer defines each pixel area by the pixel electrode and the pixel define layer. In other words, one pixel area may be defined as an area formed with one organic emission unit layer which is contacted with one pixel electrode divided by the pixel define layer.

For example, in the display device according to an embodiment, the organic emission layer may be defined as a first pixel area, a second pixel area and a third pixel area, and each pixel area is spaced apart from each other leaving a predetermined interval by the pixel define layer.

In an embodiment, the organic emission layer may emit a third light belong to visible light region or belong to UV region. That is, each of the first to the third pixel areas of the organic emission layer may emit a third light. In an embodiment, the third light may be a light having a higher energy in the visible light region, for example, may be blue light, and optionally green light. When all pixel areas of the organic emission layer are designed to emit the same light, each pixel area of the organic emission layer may be all formed of the same or similar materials or may exhibit the same or similar properties. A process difficulty of forming the organic emission layer may be decreased, and the display device may be applied for, e.g., formed by or used in, a large scale/large area process. However, the organic emission layer according to an embodiment is not necessarily limited thereto, but the organic emission layer may be designed to emit at least two different lights.

The organic emission layer includes an organic emission unit layer in each pixel area, and each organic emission unit layer may further include an auxiliary layer (e.g., hole injection layer (HIL), hole transport layer (HTL), electron transport layer (ETL), etc.) besides the emission layer.

The common electrode may function as a cathode of the display device. The common electrode may be formed of a transparent conductive material such as indium tin oxide (ITO) or indium zinc oxide (IZO). The common electrode may be formed on the organic emission layer and may be integrated therewith.

A planarization layer or a passivation layer may be formed on the common electrode. The planarization layer may include a (e.g., transparent) insulating material for ensuring electrical insulation with the common electrode.

Figure 4:
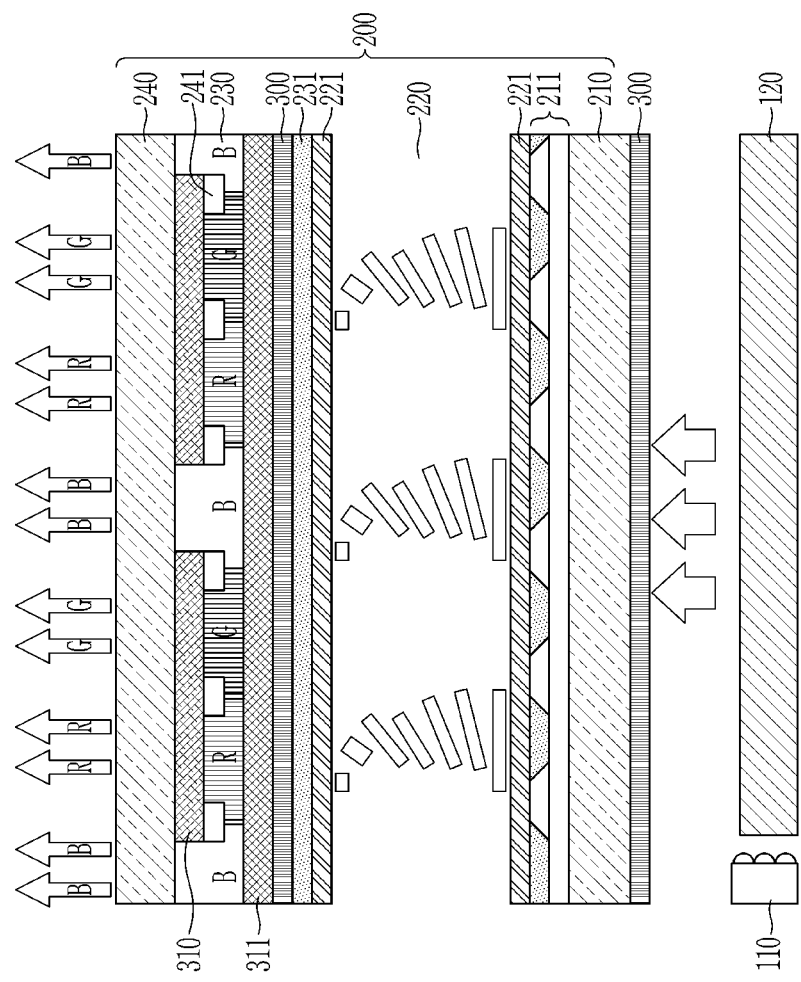
FIG. 4 is a schematic cross-sectional view of a display device according to an embodiment.

Referring to FIG. 4, a display device (e.g., a liquid crystal display device) may include a lower substrate 210, an optical element (e.g., polarizer) 300 disposed below the lower substrate 210, and a liquid crystal layer 220 interposed between a stacked structure and the lower substrate 210. The stacked structure may be disposed in such a manner that a light emitting layer (i.e., the quantum dot-polymer composite pattern) faces the liquid crystal layer. The display device may further include an optical element (e.g., polarizer) 300 between the liquid crystal layer 220 and the light emitting layer. Materials and structures of the polarizer 300 are known and are not particularly limited. The light source 110 may further include an LED and optionally a light guide panel 120. As shown, the backlight unit (e.g., emitting blue light) may be disposed under the polarizer 300.

The stacked structure includes a transparent substrate (or an upper substrate) 240 and a light emission layer (hereinafter, also referred to as photoluminescent layer) 230 including a pattern including a quantum dot-polymer composite.

The lower substrate 210 (also referred to as an array substrate) may be a transparent insulating material substrate. The substrate is the same as described above. A wire plate 211 is provided on an upper surface of the lower substrate 210. The wire plate 211 may include a plurality of gate wires and data wires that define a pixel area, a thin film transistor disposed adjacent to a crossing region of gate wires and data wires, and a pixel electrode for each pixel area, but is not limited thereto. Details of such a wire plate are known and are not particularly limited.

The liquid crystal layer 220 may be disposed on the wire plate 211. The liquid crystal layer 220 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are known and are not particularly limited.

An upper optical element or an upper polarizer 300 may be provided between the liquid crystal layer 220 and the light emission layer 230. The polarizer may be any polarizer that used in a liquid crystal display device. The polarizer may be TAC (triacetyl cellulose) having a thickness of less than or equal to about 200 µm, but is not limited thereto. In an embodiment, the upper optical element may be a coating that controls a refractive index without a polarization function.

The backlight unit includes a light source 110. The light source may emit blue light (shown) or white light. The light source may include a blue (or green) LED, a (white) LED, a (white) OLED, or a combination thereof, but is not limited thereto.

The backlight unit may further include a light guide panel 120. In an embodiment, the backlight unit may be an edge-type lighting. For example, the backlight unit may include a reflector, a light guide panel provided on the reflector and providing a planar light source with the liquid crystal panel 200, at least one optical sheet on the light guide panel, for example, a diffusion plate, a prism sheet, and the like, or a combination thereof, but is not limited thereto. The backlight unit may not include a light guide panel. In an embodiment, the backlight unit may be a direct lighting. For example, the backlight unit may have a reflector, and may have a plurality of fluorescent lamps disposed on the reflector at regular intervals, or may have an LED operating substrate on which a plurality of light emitting diodes may be disposed, a diffusion plate thereon, and optionally at least one optical sheet. Details (e.g., each component of a light emitting diode, a fluorescent lamp, light guide panel, various optical sheets, and a reflector) of such a backlight unit are known and are not particularly limited.

A black matrix 241 is provided under the transparent substrate 240 and has openings and hides a gate line, a data line, and a thin film transistor of the wire plate on the lower substrate. For example, the black matrix 241 may have a lattice shape. The photoluminescent layer 230 is provided in the openings of the black matrix 241 and has a quantum dot-polymer composite pattern including a first section (R) configured to emit a first light (e.g., red light), a second section (G) configured to emit a second light (e.g., green light), and a third section (B) configured to emit/transmit, for example blue light. If desired, the photoluminescent layer may further include at least one fourth section. The fourth section may include a quantum dot that emits light of different color from light emitted from the first to third sections (e.g., cyan, magenta, and yellow light).

In the light emission layer 230, sections forming a pattern may be repeated corresponding to pixel areas formed on the lower substrate. A transparent common electrode 231 may be provided on the photoluminescent layer 230 (e.g., photoluminescent color filter layer).

The third section (B) configured to emit/transmit blue light may be a transparent color filter that does not change a light emitting spectrum of the light source. In this case, blue light emitted from the backlight unit may enter in a polarized state and may be emitted through the polarizer and the liquid crystal layer. If desired, the third section may include a quantum dot emitting blue light.

As explained above, if desired, the display device or the light emitting device may further include an excitation light blocking layer or a first optical filter layer (hereinbelow, referred to as a first optical filter layer). The first optical filter layer may be disposed between bottom surfaces of the first section (R) and the second section (G) and a substrate (e.g., the upper substrate 240) or on a top surface of a substrate (e.g., the upper substrate 240). The first optical filter layer may include a sheet having openings that correspond to a pixel area showing a blue color (e.g., third section). In other words, the first optical filter layer may be integrally formed as one body structure at the portions except portions overlapped with the third section, but is not limited thereto. At least two (e.g., three) first optical filter layers may be spaced apart and be disposed on each of the positions overlapped with the first and the second sections and optionally the third section. When the light source includes a green light emitting element, a green light cut filter layer may be disposed on the third section.

In an embodiment, the first optical filter layer may block light having a portion of a wavelength region in the visible light region. The first optical filter layer may transmit light having other (visible light) wavelength regions. For example, the first optical filter layer may block blue light (or green light) and transmit light except blue (or green) light. For example, the first optical filter layer may transmit green light, red light, or yellow light that is mixed light thereof. The first optical filter layer may transmit blue light and block the green light and may be disposed on the blue light emitting pixel.

In an embodiment, the first optical filter layer may substantially block excitation light and may transmit light of desired wavelength. In an embodiment, the first optical filter layer may have light transmittance of greater than or equal to about 70%, greater than or equal to about 80%, greater than or equal to about 90%, or about 100% with respect to a light of a desired wavelength range.

In an embodiment, a first optical filter layer selectively transmitting red light may be disposed on the portion overlapped with the section emitting red light and the first optical filter layer selectively transmitting green light may be disposed on the portion overlapped with the section emitting green light, respectively. In an embodiment, the first optical filter layer may include a first region, a second region, or a combination thereof, wherein the first region blocks (e.g., absorb) blue light and red light and transmits light having a wavelength of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). In an embodiment, the excitation light may include blue light and green light, and a first optical filter layer may further include a third region that blocks the green light and selectively transmit blue light.

The first region may be disposed at a place overlapped with the section emitting green light. The second region may be disposed at a place overlapped with the section emitting red light. The third region may be disposed at a place overlapped with the section emitting or transmitting blue light.

The first region, the second region, and optionally the third region may be optically isolated. The first optical filter layer may contribute to improving color purity of a display device.

The display device may further include a second optical filter layer 311 (e.g., red/green light or yellow light recycling layer) that is disposed between the light emitting layer 230 and the liquid crystal layer 220, and between the light emitting layer 230—(e.g., the quantum dot polymer composite layer) and the upper polarizer 300. The second optical filter layer 311 may transmit at least a portion of a third light (i.e., excitation light), and reflect at least a portion of a first light, a second light, or a first light and a second light. The first light may be red light. The second light may be green light. The third light may include blue light. The second optical filter layer may transmit the third light (B) of a blue light wavelength range having a wavelength of less than or equal to 500 nm. Light of a wavelength range of greater than about 500 nm (e.g., red light R, green light G, or yellow light) may not be allowed to pass the second optical filter and may be reflected thereby. The reflected green light and red light is then transmitted through the first and second sections and is emitted out of the display device.

In the display device according to an embodiment, the first optical filter layer, the second optical filter layer, or the first optical filter layer and the second optical filter layer may be formed as an integrated single layer having an approximately planar surface.

In an embodiment, the first optical filter layer may include a dye and/or pigment of absorbing light of a predetermined wavelength to be blocked. The first optical filter layer, the second optical filter layer, or the first optical filter layer and the second optical filter layer may include a monolayer having a low refractive index, for example, and it may be a transparent thin film having a refractive index of less than or equal to about 1.4, less than or equal to about 1.3, or less than or equal to about 1.2. The first or second optical filter layer having a low refractive index may be, for example, a porous silicon oxide, a porous organic material, a porous organic/inorganic composite, or a combination thereof.

In an embodiment, the second (or first) optical filter layer may include a plurality of layers having different refractive indexes, for example, the second (or first) optical filter layer may be formed by alternately stacking two layers having different refractive indexes, or for example, the second or first optical filter layer may be formed by alternately stacking a material having a high refractive index and a material having a low refractive index.

Figure 5A:
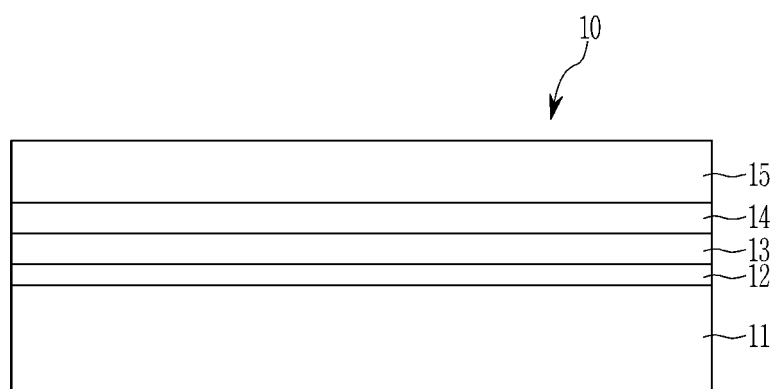
FIG. 5A is a schematic cross-sectional view of a light emitting device according to an embodiment.

Referring to FIG. 5A, the electronic device 10 may include a first electrode 11 and a second electrode 15 each having a surface opposite the other and an active layer 13 disposed between the first and the second electrodes and including the aforementioned quantum dot composite. The first electrode 11 or the second electrode 15 may be an anode and the other may be a cathode. In particular, the first electrode 11 is an anode and the second electrode 15 is a cathode as discussed further below.

In an embodiment, the electronic device may be an electroluminescent device. The active layer 13 may be an light emissive layer that includes the core shell quantum dots, and where an electron and a hole injected from cathode 15 and anode 11, respectively, are recombined to form an exciton and according to the energy of the formed exciton, light having a predetermined wavelength is emitted. In an embodiment, the electronic device including the quantum dot may be a photodetector or a solar cell. The active layer 13 may be a light absorptive layer and the core shell quantum dot of the active layer 13 may absorb a photon from outside, which will then be separated into a hole and an electron and provide the same with the anode 11 and the cathode 15, respectively.

In an embodiment, the electronic device may include a hole auxiliary layer 12 between the first electrode (anode) 11 and the active layer 13 and/or an electron auxiliary layer 14 between the second electrode (cathode) 15 and the active layer 13.

The light emitting device may further include a substrate (not shown). The substrate may be disposed at the side of the anode 11 or the cathode 15, or at the sides of both electrodes. In an embodiment, the substrate may be disposed at an opposite surface of the first electrode (anode). The substrate may include an insulating material (e.g., insulating transparent substrate).

The substrate may include glass; a polymer such as a polyester (e.g., polyethylene terephthalate (PET), polyethylene naphthalate (PEN)), a polycarbonate, a polyacrylate, a polyimide, a poly(amide-imide), a polysiloxane (e.g. PDMS), or a combination thereof; an inorganic material such as $Al_2O_3$, ZnO, or a combination thereof; or a combination comprising a least two of the foregoing, but is not limited thereto. The substrate may be made of a silicon wafer. As used herein, the term "transparent" refers to having a transmittance of greater than or equal to about 85% of light having a predetermined wavelength (e.g., light emitted from a quantum dot), or for example, transmittance of greater than or equal to about 88%, greater than or equal to about 90%, greater than or equal to about 95%, greater than or equal to about 97%, or greater than or equal to about 99%, e.g., about 85% to about 99.99%, or about 90% to about 99.9%. A thickness of the substrate may be appropriately selected considering a substrate material but is not particularly limited. The transparent substrate may be flexible.

The first electrode 11 may be made of an electrically conductive material, for example a metal, a conductive metal oxide, or a combination thereof. The first electrode 11 may include, for example, a metal or an alloy thereof, the metal including nickel, platinum, vanadium, chromium, copper, zinc, and gold; a conductive metal oxide such as zinc oxide, indium oxide, tin oxide, indium tin oxide (ITO), indium zinc oxide (IZO), or fluorine doped tin oxide; or a combination of metal and a metal oxide such as ZnO and Al or $SnO_2$ and Sb, but is not limited thereto.

The second electrode 15 may be made of a conductive material, for example a metal, a conductive metal oxide, a conductive polymer, or a combination thereof. The second electrode 15 may include, for example, a metal or an alloy thereof, such as aluminum, magnesium, calcium, sodium, potassium, titanium, indium, yttrium, lithium, gadolinium, silver, gold, platinum, tin, lead, cesium, or barium; a multi-layer structured material such as LiF/Al, $Li_2O$/Al, 8-hydroxyquinolinolato-lithium/aluminum (Liq/Al), LiF/Ca, or $BaF_2$/Ca, but is not limited thereto. A combination comprising at least two of the foregoing may also be used. The conductive metal oxide is the same as described above.

In an embodiment, a work function of the first electrode 11 and a work function of the second electrode 15 are not particularly limited and selected appropriately. A work function of the first electrode may be higher than or lower than a work function of the second electrode.

At least one of the first electrode 11 and the second electrode 15 may be a light-transmitting electrode and the light-transmitting electrode may be for example made of a conductive oxide such as a zinc oxide, an indium oxide, a tin oxide, an indium tin oxide (ITO), an indium zinc oxide (IZO), a fluorine doped tin oxide, a metal thin layer including a single layer or a multilayer, or a combination thereof. In case where any of the first electrode 11 and the second electrode 15 is a non-light-transmitting (e.g., non-transparent) electrode, it may include, for example, an opaque conductive material such as aluminum (Al), silver (Ag), gold (Au), or a combination thereof.

A thickness of the electrodes (the first electrode and/or the second electrode) is not particularly limited and may be appropriately selected with consideration of the device efficiency. For example, the thickness of the electrodes may be greater than or equal to about 5 nanometers (nm), for example, greater than or equal to about 50 nm, or greater than or equal to about 1 μm. For example, the thickness of the electrodes may be less than or equal to about 100 micrometers (μm), for example, less than or equal to about 10 μm, less than or equal to about 1 μm, less than or equal to about 900 nm, less than or equal to about 500 nm, or less than or equal to about 100 nm.

The active layer 13 includes (e.g., a plurality of) the aforementioned core shell quantum dot(s). The active layer may include at least one monolayer of the quantum dots. The active layer 13 may include at least one monolayer (e.g., at least two monolayers, at least three monolayers, at least four monolayers) of the quantum dot. The number of the monolayers of the quantum dots may be less than or equal to about 20, less than or equal to about 10, less than or equal to about 9, less than or equal to about 8, less than or equal to about 7, or less than or equal to about 6.

The active layer 13 may have a thickness of greater than or equal to about 5 nm, for example, greater than or equal to about 10 nm, greater than or equal to about 20 nm, or greater than or equal to about 30 nm and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The active layer 13 may have for example a thickness of about 10 nm to about 150 nm, for example about 20 nm to about 100 nm or about 30 nm to about 50 nm.

The light emitting device of an embodiment may further include a hole auxiliary layer 12. In a non-limiting embodiment, the hole auxiliary layer 12 may be disposed between the first electrode 11 and the active layer 13. The hole auxiliary layer 12 may have one layer or two or more layers, and may include, for example, a hole injection layer (HIL), a hole transport layer (HTL), an electron blocking layer, or a combination thereof. The hole auxiliary layer 12 may include a single component layer or a multi-layered structure wherein adjacent layers include different components from each other.

The hole auxiliary layer 12 may have a HOMO energy level that may match a HOMO energy level of the active layer 13 in order to facilitate mobility of holes from the hole auxiliary layer 12 into the active layer 13. In an embodiment, the hole auxiliary layer 12 may include a hole injection layer proximate to the first electrode 11 and a hole transport layer proximate to the active layer 13.

A material included in the hole auxiliary layer 12 (for example, a hole transporting layer or a hole injection layer) is not particularly limited and may include, for example, poly(9,9-dioctyl-fluorene-co-N-(4-butylphenyl)-diphenylamine) (TFB), polyarylamine, poly(N-vinylcarbazole), poly(3,4-ethylenedioxythiophene) (PEDOT), poly(3,4-ethylenedioxythiophene): polystyrene sulfonate (PEDOT:PSS), polyaniline, polypyrrole, N,N,N',N'-tetrakis(4-methoxyphenyl)-benzidine (TPD), 4,4'-bis[N-(1-naphthyl)-N-phenylamino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolylamino) phenylcyclohexane (TAPC), a p-type metal oxide (e.g., NiO, $WO_3$, $MoO_3$, etc.), a carbon-based material such as graphene oxide, or a combination thereof, but is not limited thereto.

If used, the electron blocking layer (EBL) may include, for example, poly(3,4-ethylenedioxythiophene):poly(styrene sulfonate) (PEDOT:PSS), poly(9,9-dioctyl-fluorene-co-N-(4-butylphenyl)-diphenylamine) (TFB), polyarylamine, poly(N-vinylcarbazole), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

In the hole auxiliary layer(s), a thickness of each layer may be appropriately selected depending on the desired characteristics of each layer. For example, the thickness of each layer may be greater than or equal to about 5 nm, greater than or equal to about 10 nm, greater than or equal to about 15 nm, greater than or equal to about 20 nm and less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, or less than or equal to about 30 nm, but is not limited thereto.

In an embodiment, the electron auxiliary layer 14 may be disposed between the active layer 13 and the second electrode 15. The electron auxiliary layer 14 may include, for example, an electron injection layer (EIL) facilitating the injection of the electrons, an electron transport layer (ETL) facilitating the transport of the electrons, a hole blocking layer (HBL) blocking the hole movement, or a combination thereof, but is not limited thereto.

In an embodiment, the EIL may be disposed between the ETL and the cathode. In an embodiment, the HBL may be disposed between the ETL (or the EIL) and the emissive layer, but is not limited thereto. In an embodiment, a thickness of each layer may be selected appropriately and may be greater than or equal to about 1 nm and less than or equal to about 500 nm, but is not limited thereto. The EIL may be an organic layer (e.g., prepared by vapor deposition).

The ETL may include an inorganic oxide nanoparticle, an organic layer (e.g., prepared by vapor deposition), or a combination thereof.

The electron transport layer, the electron injection layer, or a combination thereof may include, for example, 1,4,5,8-naphthalene-tetracarboxylic dianhydride (NTCDA), bathocuproine (BCP), tris[3-(3-pyridyl)-mesityl]borane (3TPYMB), LiF, Alq$_3$, Gaq$_3$, Inq$_3$, Znq$_2$, Zn(BTZ)$_2$, BeBq$_2$, ET204 (8-(4-(4,6-di(naphthalen-2-yl)-1,3,5-triazin-2-yl) phenyl)quinolone), 8-hydroxyquinolinato lithium (Liq), an n-type metal oxide (e.g., ZnO, HfO$_2$, etc.), or a combination thereof, but is not limited thereto.

In an embodiment, the electron auxiliary layer 14 may include an electron transport layer. The ETL may include a plurality of nanoparticles.

The nanoparticles include a metal oxide including zinc.

The metal oxide may include zinc oxide, zinc magnesium oxide, or a combination thereof. The metal oxide may include $Zn_{1-x}M_xO$ (wherein M is Mg, Ca, Zr, W, Li, Ti, Y, Al, or a combination thereof and $0 \leq 0 \leq 0.5$). In an embodiment, the M may be magnesium (Mg). In an embodiment, x may be greater than or equal to about 0.01 and less than or equal to about 0.3, for example, less than or equal to about 0.25, less than or equal to about 0.2, or less than or equal to about 0.15.

An absolute value of LUMO of quantum dots included in the emission layer may be smaller than an absolute value of LUMO of the metal oxide. In an embodiment, an absolute value of LUMO of quantum dots may be larger than an absolute value of LUMO of a metal oxide of ETL. An average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm.

The hole blocking layer (HBL) may include, for example, 1,4,5,8-naphthalene-tetracarboxylic dianhydride (NTCDA), bathocuproine (BCP), tris[3-(3-pyridyl)-mesityl]borane (3TPYMB), LiF, Alq$_3$, Gaq$_3$, Inq$_3$, Znq$_2$, Zn(BTZ)$_2$, BeBq$_2$, or a combination thereof, but is not limited thereto.

In an embodiment, the thickness of the electron auxiliary layer 14 (e.g., the thickness of each of an electron injection layer, an electron transport layer, or a hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

Figure 5B:
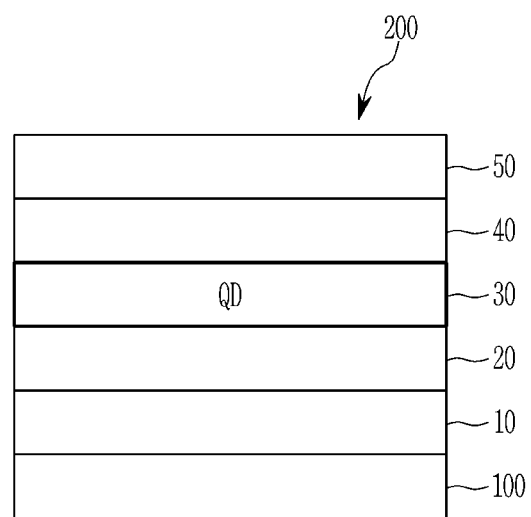
FIG. 5B is a schematic cross-sectional view of a light emitting device according to an embodiment.

Referring to FIG. 5B, an electroluminescent device of an embodiment may have a normal structure. The electroluminescent device 200 may include a transparent substrate 100, an anode 10 disposed on the transparent substrate 100 and a cathode 50 facing the anode 10. The anode 10 may include a metal oxide-based transparent electrode and a cathode 50 facing the anode may include a metal of a relatively low work function. For example, the anode may be an electrode including indium tin oxide (ITO, a work function of about 4.6 eV and about 5.1 eV) and the cathode may be an electrode including magnesium (Mg, a work function of about 3.66 eV), aluminum (Al, a work function of about 4.28 eV) or a combination thereof. In an embodiment, a hole auxiliary layer 20 may be disposed between the anode 10 and the quantum dot active layer 30. The hole auxiliary layer 20 may include a hole transporting layer, a hole injecting layer, or a combination thereof. If present, the hole injecting layer may be disposed proximate to the anode 10 and the hole transporting layer may be disposed proximate to the quantum dot active layer. In an embodiment, an electron auxiliary layer 40 may be disposed between the quantum dot active layer 30 and the cathode 50. The electron auxiliary layer 40 may include an electron injection layer and/or an electron transporting layer. The electron injection layer may be disposed proximate to the cathode 50 and the electron transporting layer may be disposed proximate to the quantum dot active layer 30.

Figure 5C:
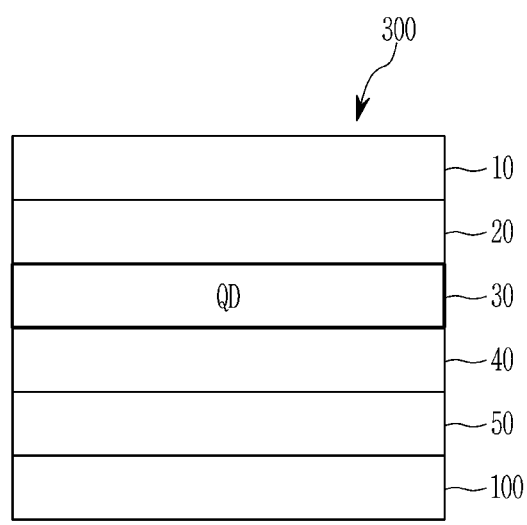
FIG. 5C is a schematic cross-sectional view of a light emitting device according to an embodiment.

Referring to FIG. 5C, a device according to an embodiment may have an inverted structure. An electroluminescent device having the inverted structure may include a cathode 50 disposed on a transparent substrate 100 and an anode 10 facing the cathode. The cathode 50 may include a metal oxide-based transparent electrode (e.g., ITO) and the anode facing the same may include a metal of a relatively high work function. In an embodiment, the anode 50 may be an electrode including indium tin oxide (ITO, a work function of about 4.6 eV and about 5.1 eV) and the cathode may be an electrode including gold (Au, a work function of about 5.1 eV), silver (Ag, a work function of about 4.26 eV), aluminum (Al, a work function of about 4.28 eV), or a combination thereof.

In an embodiment, an electron auxiliary layer 40 may be disposed between the cathode 50 and the quantum dot active layer 30. The electron auxiliary layer 40 may include an electron transporting layer, an electron injecting layer, or a combination thereof. If present, the electron injecting layer may be disposed proximate to the cathode 50 and the electron transporting layer may be disposed proximate to the quantum dot active layer 30. In an embodiment, an electron auxiliary layer 40 may be disposed between the quantum dot active layer 30 and the cathode 50. The electron auxiliary layer 40 (e.g., the electron transporting layer) may include a metal oxide such as a crystalline Zn oxide or n-type doped metal oxide. A hole auxiliary layer 20 may be disposed between the anode 10 and the quantum dot active layer 30. The hole auxiliary layer 20 may include a hole transporting layer, a hole injecting layer, or a combination thereof. If present, the hole injecting layer may be disposed proximate to the anode 10 and the hole transporting layer may be disposed proximate to the quantum dot active layer. The hole transport layer (HTL) may include TFB, PVK, or a combination thereof, and the hole injection layer (HIL) may include MoO$_3$ or another p-type metal oxide, or a combination thereof.

The electroluminescent device may emit light of a predetermined wavelength generated in the active layer 30 through a transparent electrode and a transparent substrate. For example, referring to FIG. 5B, the anode 10 include a transparent electrode based on indium tin oxide (ITO), the light generated in the active layer may pass the anode 10 and the transparent substrate 100 and emit out of the device. Referring to FIG. 5C, the cathode 50 include a transparent electrode based on indium tin oxide (ITO), the light generated in the active layer may pass the cathode 50 and the transparent substrate 100 and emit out of the device.

The device of the embodiment may be prepared in an appropriate manner. In an embodiment, the electroluminescent device may be prepared by forming a charge (e.g., hole or electron) auxiliary layer on a substrate having an electrode thereon, forming an active layer including the quantum dots (e.g., a pattern of the aforementioned quantum dots) thereon, and forming an electrode (optionally together with a charge (e.g., electron or hole) auxiliary layer) thereon. The formation of the electrode/hole auxiliary layer/electron auxiliary layer is not particularly limited and the electrode, the hole auxiliary layer, and the electron auxiliary layer may be each independently formed in an appropriate manner (e.g., via a physical or chemical deposition or a coating).

Hereinafter, the embodiments are illustrated in more detail with reference to examples. However, they are exemplary examples of the present disclosure, and the present disclosure is not limited thereto.

EXAMPLES

Analysis Method
1. Photoluminescence Analysis

A photoluminescence (PL) spectrum of the produced nanocrystals are obtained using a Hitachi F-7000 spectrometer at an irradiation wavelength of 372 nanometers (nm).
2. Ultraviolet (UV) Spectroscopy Analysis UV spectroscopy analysis is performed using an Agilent Cary 5000 spectrometer.
3. Inductively Coupled Plasma (ICP) Analysis An inductively coupled plasma-atomic emission spectroscopy (ICP-AES) analysis is performed using Shimadzu ICPS-8100.
4. X-ray photoelectron Spectroscopy (XPS) Analysis An X-ray photoelectron Spectroscopy analysis is performed using Quantum 2000 manufactured by Physical Electronics.

Synthesis is performed under an inert gas atmosphere (or nitrogen flowing condition) unless particularly stated otherwise.

Example 1

[1] Selenium and tellurium are dispersed in trioctylphosphine (TOP) to obtain a 0.4 molar (M) Se/TOP stock solution and a 0.5 M Te/TOP stock solution. A solution is prepared from the Te/TOP stock solution, an organic ligand including oleyl amine, and lithium aluminum hydride. An acetone solution of zinc chloride (conc. 1M) is also prepared.

In a 300 milliliters (mL) reaction flask, 0.9 mmol of zinc acetate is dissolved in octadecene and oleic acid is added. The reaction mixture (flask) is heated under vacuum at 120° C. After one hour at 120° C., the atmosphere in the flask is replaced with an inert gas (nitrogen), and the reaction flask is heated to 300° C.

To the heated reaction flask the Se/TOP stock solution is injected into the reaction mixture, and the temperature of the reaction flask is lowered to about 280° C. Then dodecane thiol and the acetone solution of the zinc chloride are added to the reaction flask, and the resulting mixture is stirred. In the reaction mixture, one mole of Te is used per one mole of the hydride compound. The reactor is cooled to room temperature and acetone is added to facilitate the forming of a precipitate, which is separated via centrifugation to provide treated ZnTeSe cores. The treated ZnTeSe cores are then dispersed in toluene.

[2] Sulfur is dispersed in trioctylphosphine (TOP) to obtain a 1 molar (M) S/TOP stock solution. As a gallium precursor, Ga(oleate) is dispersed in TOP and ODE (octadecene) to obtain a 0.4 M of gallium stock solution.

To a 300 mL reaction flask, trioctylamine (TOA), zinc acetate, and oleic acid are added, and the mixture is heated under vacuum at 120° C. for one hour. The atmosphere in the flask is replaced with an inert atmosphere (nitrogen), and the flask is heated to a temperature to greater than about 250° C.

To the heated reaction mixture, the ZnTeSe cores prepared above and the Se/TOP stock solution are each added, and the reaction proceeds for 10 minutes.

Then, to the reaction flask, the gallium precursor, Ga(oleate), and the S/TOP stock solution is added to form a layer further including gallium and sulfur, and then the zinc precursor and the S/TOP stock solution is added to form a ZnS layer.

After the completion of the reaction, the flask is cooled to room temperature and acetone is added to facilitate formation of a precipitate, and the ZnTeSe/ZnSe/gallium containing ZnS core-shell quantum dots are separated via centrifugation. The separated core-shell quantum dots are dispersed in toluene.

During the shell formation, with respect to 0.9 mmol of Zn, an added amount of Se and an added amount of S are about 0.1 mmol and about 0.4 mmol, respectively, and an added amount of gallium is about 1.2 mmol.

With respect to the cores and the core-shell quantum dots as prepared, a UV-Vis absorption spectroscopy analysis and a photoluminescent spectroscopy analysis is conducted and the results are summarized in Table 1.

Figure 6:
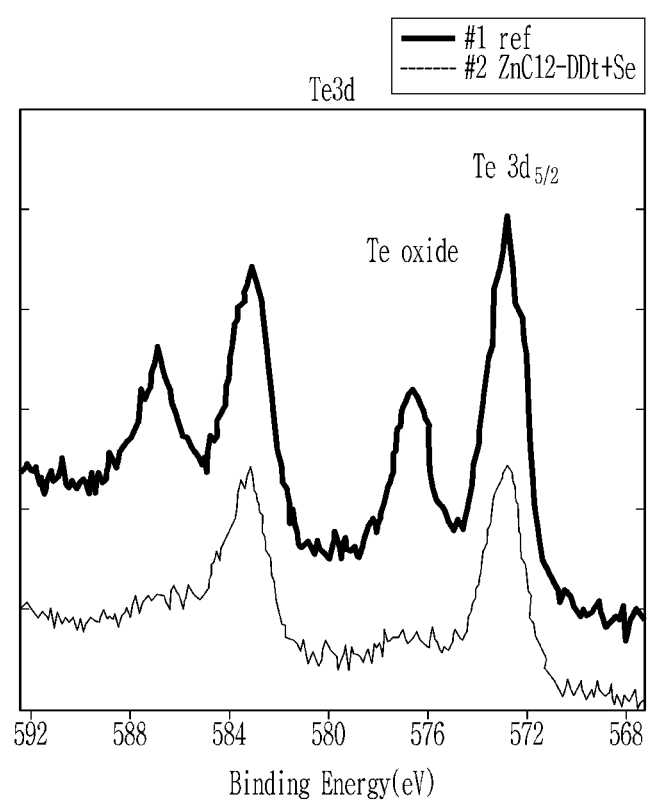
FIG. 6 is a X ray photoelectron spectrum (XPS) of the core particles synthesized in Example 1 and Comparative Example 1.

An XPS analysis is made for the core shell quantum dots and the results are shown in FIG. 6 and Table 1.

With respect to the core-shell quantum dots an ICP-AES analysis is conducted and the results are shown in Table 2.

Comparative Example 1

A core-shell quantum dots are prepared in the same manner as in Example 1 except that during the core formation, the dodecane thiol and the acetone solution of the zinc chloride are not used in the reaction preparation. The obtained core and the obtained core-shell quantum dots are dispersed in toluene.

A UV-Vis absorption spectroscopy analysis and a photoluminescent spectroscopy analysis are conducted and the results are summarized in Table 1. An XPS analysis is conducted for the core shell quantum dots and the results are shown in FIG. 6 and Table 1.

With respect to the core-shell quantum dots, an ICP-AES analysis is conducted and the results are shown in Table 2.

Example 2

A ZnTeSe/ZnS core-shell quantum dots are prepared in the same manner as in Example 1 except that during the core formation, the relative amount of the tellurium with respect to the zinc of the core or with respect to the zinc or the selenium of the quantum dots is increased as in Table 2, and during the shell formation, both the Se/TOP and the gallium precursor are not used.

During the shell formation, with respect to 0.9 mmol of Zn, about 0.1 mmol of S is added. The obtained core and the obtained core-shell quantum dots are dispersed in toluene.

With respect to the cores and the core-shell quantum dots, a UV-Vis absorption spectroscopy analysis and a photoluminescent spectroscopy analysis are conducted and the results are summarized in Table 1. An XPS analysis is conducted for the core shell quantum dots and the results are shown in Table 1.

With respect to the core-shell quantum dots, an ICP-AES analysis is conducted and the results are shown in Table 2.

Comparative Example 2

A Core-shell quantum dots are prepared in the same manner as in Example 2 except that during the core formation, the dodecane thiol and the acetone solution of the zinc chloride are not used. The obtained core and the obtained core-shell quantum dots are dispersed in toluene.

With respect to the cores and the core-shell quantum dots as prepared, a UV-Vis absorption spectroscopy analysis and a photoluminescent spectroscopy analysis are made and some of the results are summarized in Table 1. An XPS analysis is made for the core shell quantum dots thus prepared and the results are shown in and Table 1.

With respect to the core-shell quantum dots as prepared, an ICP-AES analysis is conducted and the results are listed in Table 2.

TABLE 1

| | percent XPS peak area ratio of Te oxide/Te $3d_{5/2}$ (%) | PL wavelength (nm) | PL QY (%) | FWHM (nm) |
|---|---|---|---|---|
| Example 1 core | 15% | 481 | 27 | 26 |
| Example 1 core shell | 8% | 519 | 61 | 24 |
| Comp. Example 1 core | 50% | 482 | 10 | 32 |
| Comp. Example 1 core shell | 28% | 525 | 32 | 31 |
| Example 2 core | 23% | 504 | 38 | 23 |
| Example 2 core shell | 18% | 520 | 45 | 27 |
| Comp. Example 2 core | 62% | 502 | 15 | 27 |
| Comp. Example 2 core shell | 38% | 517 | 22 | 31 |

FWHM: Full Width at Half Maximum (nm)
PL: photoluminescent
QY: quantum efficiency (%)

The results of Table 1 confirm that the quantum dots of Example 1 and Example 2 exhibit decreased amounts of the tellurium oxide and improved optical properties.

TABLE 2

| | ICP | | | |
|---|---|---|---|---|
| | Se:Zn | Te:Zn | S:Zn | Ga:Zn |
| Example 1 | 0.26:1 | 0.27:1 | 0.32:1 | 0.24:1 |
| Comp. Example 1 | 0.26:1 | 0.3:1 | 0.14:1 | 0.08:1 |
| Example 2 | 0.12:1 | 0.22:1 | 0.13:1 | — |
| Comp. Example 2 | 0.12:1 | 0.24:1 | 0.05:1 | — |

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot comprising a semiconductor nanocrystal,
    wherein the semiconductor nanocrystal comprises zinc, tellurium, and selenium,
    wherein the quantum dot further comprises sulfur, and
    wherein in an X-ray photoelectron spectrum of the quantum dot, a peak area for a Te oxide to a peak area for $Te3d_{5/2}$ as an area percentage is less than or equal to about 25%.

2. The quantum dot of claim 1, wherein the quantum dot has a mole ratio of tellurium to selenium that is greater than about 0.05:1 and less than or equal to about 4:1.

3. The quantum dot of claim 1, wherein the quantum dot has a mole ratio of tellurium to selenium that is greater than or equal to about 0.5:1 and less than or equal to about 3.5:1.

4. The quantum dot of claim 1, wherein the peak area for a Te oxide to the peak area for $Te3d_{5/2}$ as an area percentage is less than or equal to about 20%.

5. The quantum dot of claim 1, wherein the peak area for a Te oxide to the peak area for $Te3d_{5/2}$ as an area percentage is less than or equal to about 10%.

6. The quantum dot of claim 1, wherein the quantum dot further comprises an additional metal, and the additional metal comprises aluminum, gallium, lithium, or a combination thereof.

7. The quantum dot of claim 6, wherein the quantum dot has a mole ratio of the additional metal to the tellurium that is greater than or equal to about 0.001 and less than or equal to about 1.5.

8. The quantum dot of claim 1, wherein the semiconductor nanocrystal does not comprise an indium phosphide.

9. The quantum dot of claim 1, wherein the quantum dot further comprises a semiconductor nanocrystal shell disposed on a core comprising the semiconductor nanocrystal, and wherein the semiconductor nanocrystal shell comprises a zinc chalcogenide, and the zinc chalcogenide comprises selenium, sulfur, or a combination thereof.

10. The quantum dot of claim 1, wherein the quantum dot has a mole ratio of sulfur to selenium that is greater than 0.1:1 and less than or equal to about 4:1.

11. The quantum dot of claim 10, wherein the mole ratio of sulfur to selenium is greater than or equal to about 0.5:1 and less than or equal to about 2.5:1.

12. The quantum dot of claim 1, wherein the quantum dot has a mole ratio of sulfur to tellurium that is greater than 0.1:1 and less than or equal to about 3:1; or wherein the quantum dot has a mole ratio of tellurium to zinc that is greater than 0.03:1 and less than or equal to about 0.5:1.

13. The quantum dot of claim 1, wherein a maximum luminescent peak wavelength of the quantum dot is in a range of greater than about 450 nanometers and less than or equal to about 600 nanometers.

14. The quantum dot of claim 1, wherein a maximum luminescent peak wavelength of the quantum dot is in a range of greater than or equal to about 500 nanometers and less than or equal to about 560 nanometers.

15. The quantum dot of claim 1, wherein a maximum photoluminescent peak of the quantum dot has a full width at half maximum of less than or equal to about 30 nanometers.

16. The quantum dot of claim 1, wherein the quantum dot has a quantum efficiency of greater than or equal to about 35%.

17. The quantum dot of claim 1, wherein the semiconductor nanocrystal does not comprise cadmium, lead, mercury, or a combination thereof.

18. A quantum dot composite comprising a matrix and a plurality of quantum dots dispersed in the matrix, wherein the plurality of quantum dots includes the quantum dot of claim 1.

19. A display device comprising
a light emitting element,
wherein the light emitting element comprises a plurality of quantum dots, wherein the plurality of quantum dots includes the quantum dot of claim 1.

20. An electronic device comprising:
a first electrode and a second electrode each having a surface opposite the other, and
an active layer disposed between the first electrode and the second electrode, the active layer comprising a plurality of quantum dots, wherein the plurality of quantum dots includes the quantum dot of claim 1.

* * * * *